United States Patent [19]

Kuroda et al.

[11] Patent Number: 5,262,661
[45] Date of Patent: Nov. 16, 1993

[54] SOLID-STATE IMAGE PICKUP DEVICE, HAVING INCREASED CHARGE STORAGE AND IMPROVED ELECTRONIC SHUTTER OPERATION

[75] Inventors: Takao Kuroda; Sumio Terakawa, both of Osaka; Shigeru Okamoto; Katsuya Ishikawa, both of Kyoto, all of Japan

[73] Assignee: Matsushita Electric Industrial Co., Ltd., Japan

[21] Appl. No.: 710,992

[22] Filed: Jun. 6, 1991

[30] Foreign Application Priority Data

Jun. 25, 1990 [JP] Japan .................. 2-167134

[51] Int. Cl.$^5$ .................. H01L 29/78; H01L 27/14; H01L 31/00
[52] U.S. Cl. .................. 257/227; 257/230; 257/233
[58] Field of Search .................. 357/24 LR; 257/227, 257/230, 233

[56] References Cited

U.S. PATENT DOCUMENTS 4,814,848  3/1989  Akimoto et al. ............ 357/24 LR
5,191,399  3/1993  Maegawa et al. ........... 257/233

FOREIGN PATENT DOCUMENTS 178664  4/1986  European Pat. Off. .
360595  3/1990  European Pat. Off. .

OTHER PUBLICATIONS

Patent Abstracts of Japan, vol. 11, No. 304 (E-545) (2751), Oct. 3, 1987 & JP-A-62629369 (Victor Co of Japan Ltd); May 6, 1987.
Patent Abstracts of Japan, vol. 10, No. 24 (E-377) (2081), Jan. 30, 1986 & JP-A-60182768 (Sony K.K.) Sep. 18, 1985.
Patent Abstracts of Japan, vol. 11, No. 355 (E-558) (2802), Nov. 19, 1987 & JP-A-62131566 (Matsushita Electronics Corp.) Jun. 13, 1987.

Primary Examiner—William Mintel
Assistant Examiner—Robert Limanek
Attorney, Agent, or Firm—Lowe, Price, LeBlanc & Becker

[57] ABSTRACT

The impurity density of a photoelectric transducer n-layer (7) and the impurity density of a p-layer (6) of an impurity region in which the electric transducer (7) and a transfer channel (9) are formed, are each distributed to have its maximum value in a more interior part from the surface of a semiconductor substrate (5). Alternatively, i) a thin, high-density p-layer (34) and ii) a thick, low-density p-layer (33) of an impurity region in which the electric transducer (7) and the transfer channel (9) are formed may be formed. Each minimum potential in these two p-layers (33, 34) is made to have a different dependence on the voltage applied to an n-type semiconductor substrate (5). The thick, low-density p-layer (33) is formed in such a way that it comes into contact with part of the photoelectric transducer n-layer (7) at its bottom portion. The above constitution can bring about a solid-state image pickup device that can prevent the blooming phenomenon, causes less residual images, and can operate as an electronic shutter with ease.

20 Claims, 13 Drawing Sheets

SOLID-STATE IMAGE PICKUP DEVICE, HAVING INCREASED CHARGE STORAGE AND IMPROVED ELECTRONIC SHUTTER OPERATION

BACKGROUND OF THE INVENTION

1. Field of the Invention

This invention relates to a solid-state image pickup device, a process for manufacturing the device and a method of driving the device.

2. Description of the Prior Art

In recent years, solid-state image pickup devices making use of charge transfer systems as typified by a charge-coupled device (hereinafter "CCD") have been markedly put into practical use in view of their low-noise characteristics.

A structure commonly used in a conventional solid-state image pickup device will be described below with reference to accompanying drawings.

FIG. 24 is a plan view of what is called a CCD type solid-state image pickup device. The solid-state image pickup device is comprised of a photoelectric transducer area 1, a vertical CCD transfer electrode area 2, a horizontal CCD transfer electrode area 3 and an output area 4.

Upon incidence of light emitted from an object on the photoelectric transducer area 1, electron-hole pairs are produced in the photoelectric transducer area 1 by the action of light. The electrons thus produced are sent from the photoelectric transducer area 1 to the vertical CCD transfer electrode area 2. Into the vertical CCD transfer electrode area 2, electrons of photoelectric transducer areas 1 arranged in the longitudinal direction of the vertical CCD transfer electrode area 2 are sent at the same time.

Then the electrons taken out to the vertical CCD transfer electrode area 2 are sent to the horizontal CCD transfer electrode area 3. Into the horizontal CCD transfer electrode area 3, electrons of vertical CCD transfer electrode areas 2 arranged perpendicularly to the longitudinal direction of the horizontal CCD transfer electrode area 3 are sent at the same time.

The electrons thus taken out to the horizontal CCD transfer electrode area 3 are outputted through the output area 4. Output signals thus obtained pass through an image reproducing circuit and are outputted as an image of the object from an output medium such as a display device.

FIG. 25 show a cross section of the solid-state image pickup device along the line 25—25 (in FIG. 24) that passes across the photoelectric transducer areas 1 and the vertical CCD transfer electrode areas 2.

In the upper layer portion or main surface of an n-type substrate 5, a p-layer 6 having depth and density in given ranges is formed. A photoelectric transducer, an n-layer 7, is formed in a given region in the interior of the p-layer 6. A p-layer 8 with a high density is also formed in the p-layer 6 at a position spaced apart from the n-layer 7. An n-layer 9 that serves as a vertical CCD transfer channel is provided in the p-layer 8.

Signal charges accumulated in the n-layer 7 are read out to the n-layer 9 and then the signal charges are transferred within the n-layer 9 and in the direction perpendicular to the paper face of the drawing.

A high-density p-layer 10 formed on the n-layer 7 is formed so that any dark current caused by an interfacial level of Si-SiO$_2$ can be prevented from occurring.

Across the p-layer 6 and a lower layer portion 5a (or a region where none of p-layers and n-layers are formed; hereinafter "substrate 5a") of the substrate 5, a reverse bias voltage Vsub that gives positive potential to the substrate and gives negative potential to the p-layer 6 is applied by means of an electric source 11. That is to say, the reverse bias voltage Vsub is applied across the p-layer 8 and the substrate 5a. Hence, the p-layer 6 located below the photoelectric transducer formed of the n-layer 7 becomes depleted. As a result of depletion of the p-layer 6, charges that have turned excessive with respect to the quantity of the charges that can be accumulated in the n-layer 7 are released to the substrate 5a side. It is designed to prevent the blooming phenomenon in this way.

Application of a pulse voltage to the n-type substrate 5 makes it also possible to release all the signal charges in the n-layer 7 to the substrate 5a side, that is to achieve the operation of what is called an electronic shutter.

An insulating film 12 comprising SiO$_2$ or the like is formed on the surface of the substrate 5. On the insulating film 12, a vertical CCD transfer electrode 13 is formed above the p-layer 8 and n-layer 9 that constitute the vertical CCD transfer electrode area 2 and also above the region embracing a gap region between the n-layer 7 and the p-layer 8. The insulating film 12 is also formed on the side wall and upper surface of the transfer electrode 13 for the purpose of protecting the solid-state image pickup device from a physical impact or shock.

The vertical CCD transfer electrode 13 acts as an electrode for making the electrons accumulated in the n-layer 7 read out to the p-layer 8 or n-layer 9 that forms or serves as the vertical CCD transfer channel.

Thus, in order to prevent the blooming phenomenon or achieve the operation as an electronic shutter, the p-layer 6 must have density and depth in given ranges.

FIG. 26 shows impurity density distribution examined along the line 26—26 passing across the photoelectric transducer area 1 in FIG. 25.

FIG. 27 shows net values of the impurity densities shown in FIG. 26.

In both FIGS. 26 and 27, the impurity densities are plotted as ordinate, and the distance from the substrate surface is plotted as abscissa. The densities of p-type impurity atoms are indicated on the upper side of the ordinate and the densities of n-type impurity atoms are indicated on the lower side of the ordinate. Broken lines 14, 15, 16 and 17 in FIG. 26 represent the impurity densities of the p-layer 10, p-layer 6, substrate 5a and n-layer 7 in FIG. 25, respectively.

A solid line 18 in FIG. 27 represents the net values of the respective impurity densities shown in FIG. 26. The shaded region 19 corresponds to the net impurity density distribution of the photoelectric transducer n-layer 7, showing the amount of effective donors accumulated in the n-layer.

The impurity density 17 of the photoelectric transducer n-layer 7 is highest at the surface of the substrate 5. The density decreases with a depth toward the interior of the substrate 5. The p-layer 10 is formed at the upper part of the n-layer 7 so that the dark current can be decreased. The impurity density 14 of the p-layer 10 is higher than the density of the n-layer 7, and is less spread toward the interior of the substrate 5. Hence, the n-layer 7 comes to have the net impurity density 19.

The p-layer 6 has a low impurity density, but its impurity density is distributed in a broadly spread state. More specifically, its impurity density is at maximum at the surface of the substrate 5 and gradually decreases with a depth toward the interior of the substrate 5.

In the solid-state image pickup device, in order not to cause the blooming phenomenon, it is necessary for the photoelectric transducer n-layer 7 to be almost completely depleted after the electrons accumulated in the photoelectric transducer have been read out to the vertical CCD transfer electrode area. For this reason, the amount of the effective donors represented by the net impurity density 19 must be controlled to be an upper limit of the quantity of the charges that can be accumulated in the n-layer 7. In other words, it follows that the amount of effective donors determines an upper limit value of saturation characteristics of the photoelectric transducer.

The net impurity density 19 is a value obtained by subtracting the impurity density 14 of the p-layer 10 and the impurity density 15 of the p-layer 6 from a value obtained by adding the impurity density 16 of the substrate 5a to the impurity density 17. Because of the restrictions in view of each process, the net impurity density 19 depends on the impurity density 14 and impurity density 17. As to the impurity density 17, the density is highest at the surface of the substrate 5. The part where this density is highest is compensated by the impurity density 14 of the reverse conductivity type p-layer 10.

FIGS. 28 to 31 cross-sectionally illustrate a flow sheet for fabricating a conventional CCD type solid-state image pickup device.

In the main surface (i.e., the upper layer portion) of the n-type substrate 5, p-type impurity boron is ion-implanted. Thereafter, the p-layer 6 is formed by a high-temperature beat treatment. Thereafter, a resist pattern is formed by conventional photolithography on the region other than the region in which the vertical CCD transfer channel is formed. Using the resist pattern as a mask, boron is ion-implanted to form the p-layer 8. Thereafter, a resist pattern is again formed by conventional photolithography on the region other than the region in which the n-layer 9 in the p-layer 8 serving as the vertical CCD transfer channel is formed. Using the resist pattern as a mask, phosphorus is ion-implanted 2 to form the n-layer 9. Thereafter, the insulating film 12 is deposited on the main surface of the substrate 5 by thermal oxidation. An electrode material serving as the vertical CCD transfer electrode 13 is further formed on the insulating film 12 (FIG. 28).

Then, a resist pattern 20 is formed on the electrode material by photolithography on the region other than the region broader than the region that serves for the transfer electrode 13. Using the resist pattern as a mask, the electrode material is dry-etched until the insulating film 12 is uncovered. Next, using the resist pattern 20 as a mask and also making the insulating film 12 serve as a protective film, phosphorus is ion-implanted. The n-layer 7 serving as the photoelectric transducer is formed as a result of this ion implantation (FIGS. 29 to 30).

Thereafter, the resist pattern 20 is removed. On the surface of the substrate 5, an electrode material is formed with a region broader than the insulating film 12 and transfer electrode 13. Next, a resist pattern is formed on the region other than the region in which the transfer electrode 13 is formed. Using this resist pattern as a mask, the electrode material is dry-etched. Through the above process, the transfer electrode 13 is formed. At this time, the transfer electrode 13 must be provided also on the gap region between the n-layer 7, i.e., the photoelectric transducer from which electrons are read out to the vertical CCD transfer channel, and the p-layer 8. For this purpose, since in the dry etching carried out when the transfer electrode 13 is formed a side wall end of the n-layer 7 serving as the photoelectric transducer is originally on the same line with a side wall end of the transfer electrode 13, one side wall end of the transfer electrode 13 is shortened to be formed in the desired length (FIG. 30).

Next, using one end of this transfer electrode 13 and a resist as masks, boron is ion-implanted. The p-layer for preventing dark current is thus formed on the n-layer 7 (FIG. 31).

The conventional solid-state image pickup device as described above has the following disadvantages.

The impurity density 17 is highest at the surface of the substrate 5, and this part where the density is highest is compensated by the impurity density 14 of the reverse conductivity type p-layer 10. Hence, of the impurity density 17 of the n-layer 7 introduced as a photoelectric transducer, the region having a relatively low density is used as the photoelectric transducer. In other words, a photoelectric transducer with a low density results in a small amount of the effective donors that can be accumulated there, and can not achieve the quantity of saturation charges at a sufficiently high level.

Accordingly, the impurities to be lead into the region of impurity density 17 are implanted in an increased quantity. The implanted impurities are also diffused into the depth of the substrate by a high-temperature heat treatment so that the photoelectric transducer can have an increased area.

The high-temperature heat treatment, however, may result in a spread of the impurity density 17 in the direction perpendicular to the surface of the substrate 5. As a result, the impurities are also diffused in the gap region between the p-layer 8 and n-layer 7 and also in the p-layer 8, the vertical CCD transfer channel.

The positional relationship between an end portion of the n-layer 7 and the vertical CCD transfer electrode 13 is determined by the precision for the registration of the mask in the step of exposure carried out when the transfer electrode 13 is formed and also on the diffused region of the n-layer 7 formed by diffusion. For this reason, it is very difficult to control the position at which the n-layer 7 is formed by heat diffusion at a high temperature. A poor controllability for the positions of the end portion of the n-layer 7 and the vertical CCD transfer electrode 13 causes the electrons serving as signals to be left in the photoelectric transducer at the time of read-out where they are taken out from the photoelectric transducer to the vertical CCD transfer channel.

The electrons thus having been left cause the phenomenon of phantom or residual images, resulting in a serious deterioration of picture quality.

On the other hand, when the impurities are implanted in an increased quantity, faults in ion implantation increase to increase what is called white scratches. This results in a lowering of the yield.

Moreover, the p-layer 6 is formed as a single impurity layer. Hence the voltage applied to the p-layer 6 must be controlled in order to prevent the blooming phenomenon or achieve the operation as an electronic shutter.

In the device with such structure, the voltage applied to the n-type substrate 5 is usually controlled to be about 10 V in order to control the blooming phenomenon. A pulse voltage of about 30 V is also required in order to achieve the operation as an electronic shutter.

For the purpose of applying such voltages, the number of parts must be increased, resulting in an increase in power consumption, when camera-combined VTRs usually making use of the solid-state image pickup device are manufactured. This obstructs the manufacture of those being small-sized, lightweight and also of low power consumption.

SUMMARY OF THE INVENTION

An Object of the present invention is to provide a solid-state image pickup device that may hardly cause the blooming phenomenon, can prevent deterioration of picture quality and can achieve the operation as an electronic shutter at a low voltage.

Another object of the present invention is to provide a process for fabricating a solid-state image pickup device, that can form the above solid-state image pickup device through a simple process.

In an embodiment of the solid-state image pickup device, the present invention provides a solid-state image pickup device comprising a semiconductor substrate; a first semiconductor region of one conductivity type provided in said semiconductor substrate; a second semiconductor region of a conductivity type reverse to said first semiconductor region, formed in said first semiconductor region: a third semiconductor region of a conductivity type reverse to said second semiconductor region, formed adjoiningly to the surface of said second semiconductor region; and a fourth semiconductor region of the same conductivity type as said second semiconductor region, formed apart from said second semiconductor region within said first semiconductor region;

said second semiconductor region having an impurity density whose distribution in the depth direction of said semiconductor substrate has a maximum part at a more interior part from the surface of said semiconductor substrate.

In another embodiment of the solid-state image pickup device, the present invention provides a solid-state image pickup device comprising a semiconductor substrate; a first semiconductor region of one conductivity type provided in said semiconductor substrate; a second semiconductor region of a conductivity type reverse to said first semiconductor region, formed in said first semiconductor region; a third semiconductor region of a conductivity type reverse to said second semiconductor region, formed adjoiningly to the surface of said second semiconductor region; and a fourth semiconductor region of the same conductivity type as said second semiconductor region, formed apart from said second semiconductor region within said first semiconductor region;

said first semiconductor region and said second semiconductor region each having an impurity density whose distribution in the depth direction of said semiconductor substrate has a maximum part at a more interior part from the surface of said semiconductor substrate.

In still another embodiment of solid-state image pickup device, the present invention provides a solid-state image pickup device comprising a semiconductor substrate; a first semiconductor region of one conductivity type, formed in a given region of said semiconductor substrate; a second semiconductor region of a conductivity type reverse to said first semiconductor region, formed in said first semiconductor region and in the region between said first semiconductor region and another first semiconductor region adjacent thereto; a third semiconductor region of a conductivity type reverse to said second semiconductor region, formed at least on the surface of said first semiconductor region; a fourth semiconductor region of the same conductivity type as said second semiconductor region, formed apart from said second semiconductor region within said first semiconductor region; and a fifth semiconductor region of the same conductivity type as said second semiconductor substrate, formed between said first semiconductor region and another first semiconductor region-adjacent thereto.

In an embodiment of the process for fabricating a solid-state image pickup device, the present invention provides a process for manufacturing a solid-state image pickup device, comprising the steps of forming a first semiconductor region on a semiconductor substrate by first ion implantation, forming a transfer channel in said first semiconductor region, forming an insulating film on said semiconductor substrate, forming an electrode material on said insulating film, forming a second semiconductor region by second ion implantation using at least said electrode material as a mask, forming a transfer electrode by etching said electrode material, and forming a third semiconductor region adjoiningly to the surface of said second semiconductor region;

at least one of said first ion implantation and said second ion implantation being carried out at an accelerating voltage of not less than 200 keV.

The present invention also provides a method of driving a solid-state image pickup device, said device comprising a semiconductor substrate; a first semiconductor region of one conductivity type, formed in a given region of said semiconductor substrate; a second semiconductor region of a conductivity type reverse to said first semiconductor region, formed in said first semiconductor region and in the region between said first semiconductor region and another first semiconductor region adjacent thereto; a third semiconductor region of a conductivity type reverse to said second semiconductor region, formed at least on the surface of said first semiconductor region; a fourth semiconductor region of the same conductivity type as said second semiconductor region, formed apart from said second semiconductor region within said first semiconductor region; and a fifth semiconductor region of the same conductivity type as said second semiconductor substrate, formed between said first semiconductor region and another first semiconductor region adjacent thereto;

said method comprising applying a reverse bias voltage across said first semiconductor region and said semiconductor substrate in such a way that a period during which said reverse bias voltage is applied is comprised of a first application period and a second application period, the minimum potential of said first semiconductor region during the first application period is higher than the minimum potential of said fifth semiconductor region and the minimum potential of said fifth semiconductor region during the second application period is higher than the minimum potential of said first semiconductor region.

In the solid-state image pickup device according to the present invention, the n-layer that serves as a photoelectric transducer is formed by ion implantation using a high accelerating energy, and hence the impurity density distribution can be made to have a highest density region in the interior of the substrate.

This brings about an increase in the amount of the effective donors that can be accumulated in the photoelectric transducer, and achieves the quantity of saturation charges at a sufficiently high level.

Since the photoelectric transducer is formed by ion implantation, the positional relationship between the end portion of the photoelectric transducer and the vertical CCD transfer electrode can be determined by the precision for the registration of a mask in the step of exposure carried out when the transfer electrode 13 is formed. Hence it is unnecessary to control the position at which the photoelectric transducer is formed by heat diffusion at a high temperature. Thus, a high controllability can be achieved for the positions of the end portion of the photoelectric transducer and the vertical CCD transfer electrode. This makes the solid-state image pickup device hardly cause the blooming phenomenon, and makes it possible to prevent deterioration of picture quality.

In the impurity density distribution of the n-layer in which the photoelectric transducer is formed by ion implantation it is possible for the maximum value of its density to be present in the interior of the substrate. This brings about an increase in the amount of the effective donors accumulated in the photoelectric transducer. Hence, it is possible to obtain a solid-state image pickup device equipped with a photoelectric transducer having high saturation characteristics.

The p-layer for preventing dark currents is also formed on the photoelectric transducer n-layer. The n-layer serving as the photoelectric transducer is formed by ion implantation to have a maximum value in its impurity density in the interior of the substrate. Hence, the net value of the impurity density of the p-layer at the surface of the substrate can be made to have a higher density than the impurity density of the p-layer of the conventional solid-state image pickup device. This makes it possible to obtain a solid-state image pickup device equipped with a photoelectric transducer having low dark current characteristics.

Moreover, a solid-state image pickup device that can operate as an electronic shutter at a low voltage can be formed without decreasing the quantity of the charges accumulated in the photoelectric transducer.

In the process for fabricating the solid-state image pickup device of the present invention, the impurity density of the photoelectric transducer is highest in the depth of the substrate. Hence, it is unnecessary to increase the quantity of the impurities implanted in the photoelectric transducer, which has been done in the prior art. To increase the quantity of impurities necessarily brings about a considerable loss of time. Thus, in the process of the present invention, there can be no lowering of throughput at the time of the fabrication of solid-state image pickup devices. In addition, it is possible to prevent the yield from being lowered because of the white scratches.

It is also unnecessary to diffuse the implanted impurities into the depth of the substrate by a high-temperature heat treatment so that the area of the photoelectric transducer can be increased. Hence, no defects can occur in the substrate, which may be caused by the high-temperature heat treatment. Since the impurities are diffused from other diffusion layer, it is still also unnecessary to make control so as to attain the desired impurity density. There also is no possibility that the photoelectric transducer is diffused and spread as a result of the high-temperature heat treatment and consequently diffused also to the vertical CCD transfer channel or the gap region between the transfer channel and the photoelectric transducer electrode 13.

As for the positional relationship between the end portion of the photoelectric transducer and the end portion of the vertical CCD transfer electrode, it can not become difficult to control the position of the diffusion layer as a result of the high-temperature heat treatment. Hence the positional relationship between the both can be attained with ease. This can prevent the phenomena of blooming and residual image from occurring in the solid-state image pickup device, and also can stop the deterioration of picture quality.

DESCRIPTION OF THE PREFERRED EMBODIMENT

Preferred embodiments of the present invention will be described below with reference to the accompanying drawings.

Figure 1:
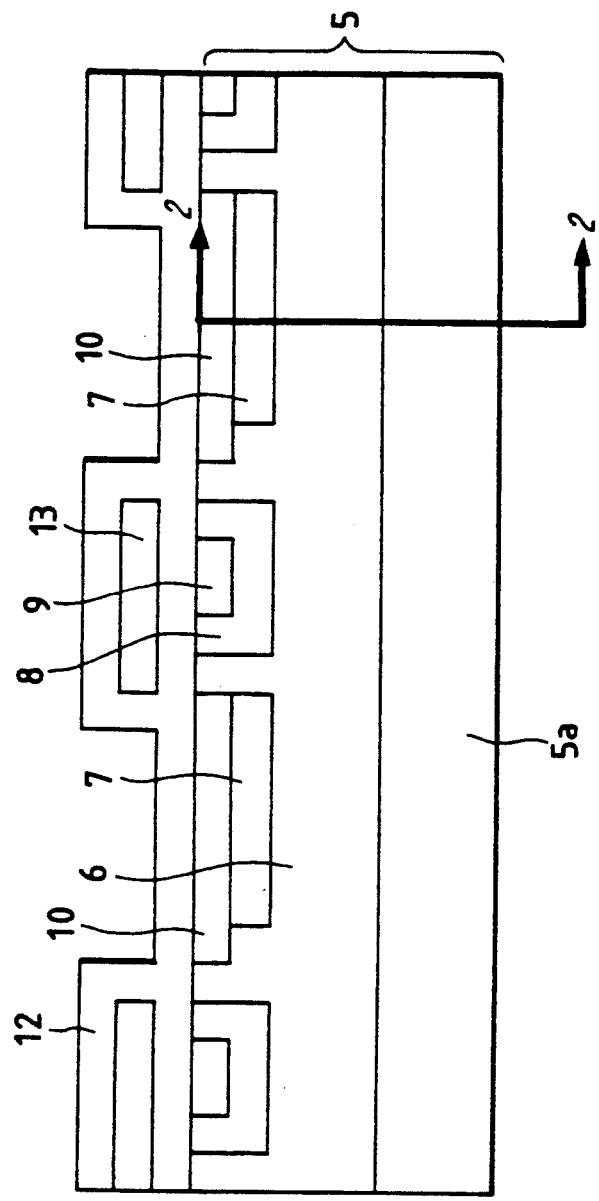
FIG. 1 is a cross section to illustrate a solid-state image pickup device according to a first embodiment of the present invention.

FIG. 1 cross-sectionally illustrates a solid-state image pickup device according to a first embodiment of the present invention.

Figure 24:
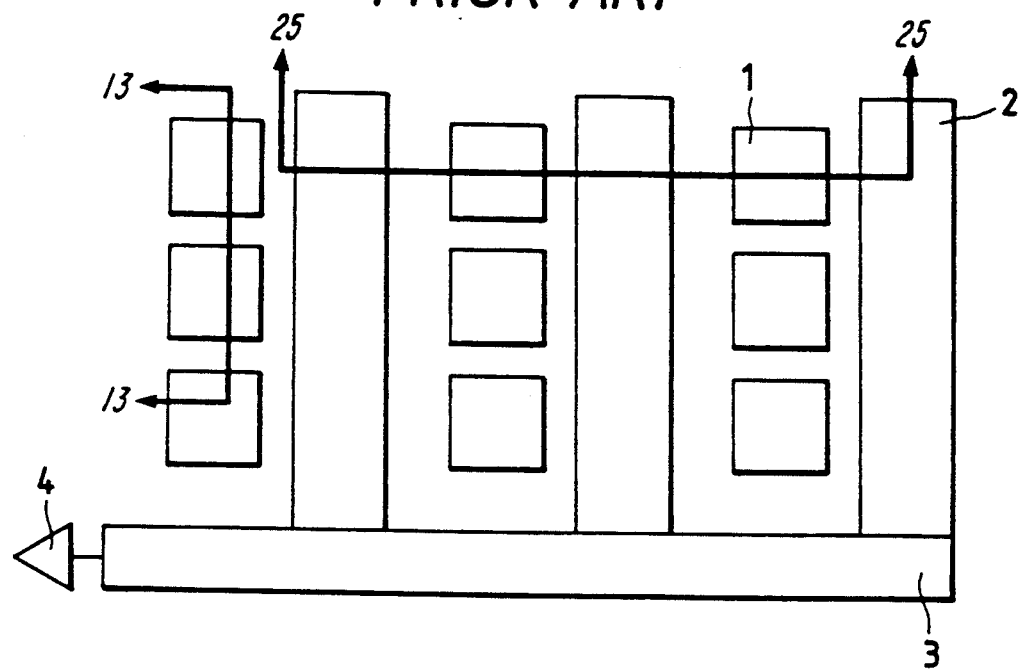
FIG. 24 is a plan view to illustrate a conventional solid-state image pickup device.

The device shown in FIG. 1 is constructed in entirely the same way as the conventional solid-state image pickup device shown in FIG. 24.

In the upper layer portion of an n-type substrate 5, a p-layer 6 having depth and density in given ranges is formed. A photoelectric transducer, an n-layer 7, is formed in a given region in the interior of the p-layer 6. A p-layer 8 with a high density is also formed in the p-layer 6 at a position spaced apart from the n-layer 7. An n-layer 9 that serves as a vertical CCD transfer channel is provided in the p-layer 8. Signal charges accumulated in the n-layer 7 are read out to the n-layer 9 and then the signal charges are transferred within the n-layer 9 and in the direction perpendicular to the paper face of the drawing. A high-density p-layer 10 is formed on the n-layer 7 and in the surface of the substrate 5. The p-layer 10 is formed so that any dark current caused by an interfacial level of Si-SiO$_2$ can be prevented from occurring.

An insulating film 12 comprising SiO$_2$ or the like is formed on the surface of the substrate 5. On the insulating film 12, a vertical CCD transfer electrode 13 is formed above the p-layer 8 and n-layer 9 that constitute the vertical CCD transfer electrode area 2 and also above the region embracing a gap region between the n-layer 7 and the p-layer 8. The insulating film 12 is also formed on the side wall and upper surface of the transfer electrode 13 for the purpose of protecting the solid-state image pickup device from a physical impact or shock.

The vertical CCD transfer electrode 13 acts also as an electrode for making the electrons accumulated in the n-layer 7 read out to the p-layer 9 via the p-layer 8 that forms the vertical CCD transfer channel.

Figure 2:
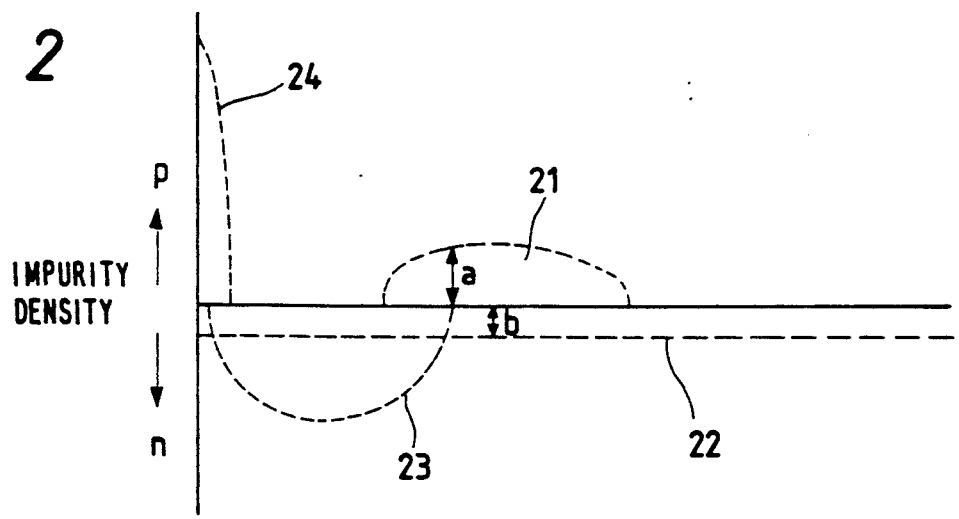
FIG. 2 is a graph to show impurity densities of the solid-state image pickup device according to the first embodiment of the present invention.

FIG. 2 shows impurity density distribution examined along the line 2—2 passing across the p-layer 10, photoelectric transducer n-layer 7, p-layer 6 and substrate 5a shown in FIG. 1.

Figure 3:
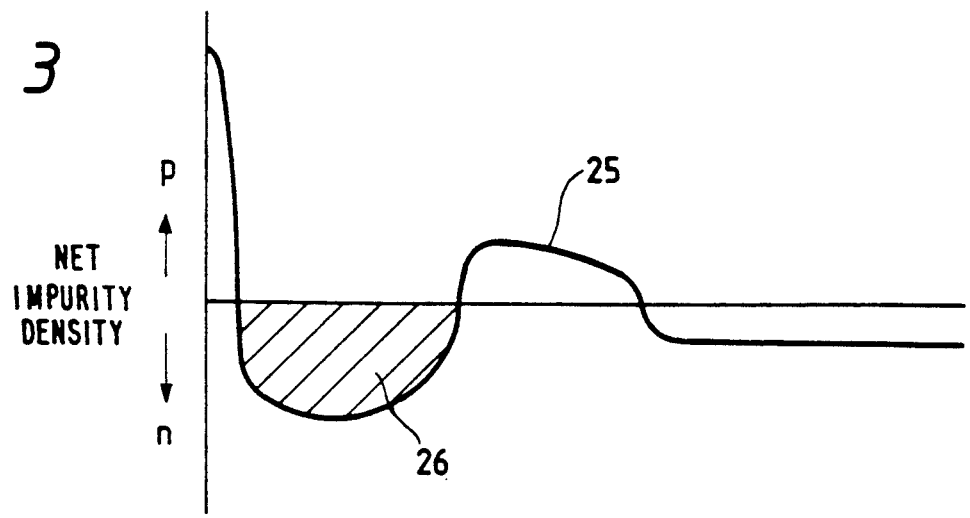
FIG. 3 is a graph to show net impurity densities of the solid-state image pickup device according to the first embodiment of the present invention.

FIG. 3 shows the net impurity distribution of the impurity density distribution shown in FIG. 2.

In the present invention, as shown in FIG. 1, the cross section of the solid-state image pickup device has the same form as that of the conventional device, but has a different impurity density distribution of the impurity layers formed. This will be more detailed below.

In both FIGS. 2 and 3, the impurity densities are plotted as ordinate, and the distance from the surface of the substrate 5 is plotted as abscissa. The densities of p-type impurities are indicated above the abscissa. i.e., on the upper side of the ordinate, and the densities of n-type impurities are indicated below the abscissa, i.e., on the lower side of the ordinate.

Broken lines 21, 22, 23 and 24 in FIG. 2 represent the impurity densities of the p-layer 6, substrate 5a, n-layer 7 and p-layer 10 in FIG. 1, respectively.

A solid line 25 in FIG. 3 represents the value obtained by synthesizing the respective impurity densities shown in FIG. 2 (which is hereinafter referred to as the net value). The shaded region 26 corresponds to the net impurity density of the photoelectric transducer n-layer 7, showing the amount of effective donors accumulated in the n-layer.

As to the impurity density 23 of the photoelectric transducer n-layer 7, a point at which the density is highest, i.e., the density is maximum, is present in the interior of the substrate 5. At the surface of the substrate 5, the impurity density of the n-layer 7 is low and the density increases with a depth toward the interior of the substrate 5. Thus, a maximum value of the impurity density of the n-layer 7 is present in the interior of the substrate 5, and the impurity density of the n-layer 7 decreases with increasing depth toward the interior of the substrate beyond the depth at which the density shows the maximum value. In the conventional solid-state image pickup device, the device is so formed to have the region in which the impurity density of the n-layer 7 is maximum at the surface of the substrate 5 or in the region of little depth corresponding to a depth at which the impurity density of the p-layer 10 for decreasing dark currents is distributed.

The p-layer 10 is formed at the upper part of the n-layer 7 so that the dark current can be decreased. The impurity density 24 of the p-layer 10 is higher than the density of the n-layer 7, where the layer is so formed that the impurity density is only a little spread toward the interior of the substrate 5.

The p-layer 6 is formed in the interior of the substrate 5 and in such a way that it overlaps at least with an end portion of the photoelectric transducer n-layer 7, located in the depth of the interior of the substrate 5. Its impurity density 21 begins to become higher from the part at which the p-layer 6 and the p-layer 7 overlap one another, and also is so distributed as to have a maximum value at the depth of the substrate 5. In the conventional solid-state image pickup device, the device is so formed to have the region in which the impurity density of the p-layer 6 is maximum at the surface of the substrate 5 or in the region of little depth corresponding to a depth at which the impurity density of the p-layer 10 for decreasing dark currents is distributed. Moreover, its impurity density is distributed in the state that it reaches a fairly great depth of the substrate 5 in a low density.

The difference in the state of distribution of impurity density between the solid-state image pickup device of the present invention and the conventional one brings about a great difference in the amount of effective donors accumulated in the photoelectric transducer.

More specifically, the amount of effective donors that is represented by the net impurity density 26 can be obtained in the following way: It can be obtained by subtracting the impurity density 24 of the p-layer 10 and the impurity density 21 of the p-layer 6 from a value obtained by adding the impurity density 22 of the substrate 5a to the impurity density 23.

In the conventional solid-state image pickup device, the device is so formed to have the region in which the impurity density of the n-layer 7 is maximum at the surface of the substrate 5 or in the region of little depth corresponding to a depth at which the impurity density of the p-layer 10 for decreasing dark currents is distributed. As a result, the region having a highest impurity density within the n-layer 7 serving as the photoelectric transducer is cancelled by the p-layer 10 formed at the surface of the substrate 5 and having the state of distribution of little depth. This results in a lowering of the absolute amount of effective doners accumulated in the photoelectric transducer. Moreover, since the impurity density of the p-layer 6 is distributed deeply, though in a low density, to the depth of the substrate 5, the impurity density of the n-layer 7 becomes lower as a whole. This also results in a lowering of the absolute amount of effective donors accumulated in the photoelectric transducer.

On the other hand, in the solid-state image pickup device of the present invention, the photoelectric transducer n-layer 7 is so formed as to have an extremely low impurity density at the surface of the substrate 5 or in the region of little depth corresponding to a depth at which the impurity density of the p-layer 10 for decreasing dark currents is distributed. Hence, the impurity density that may be cancelled in the n-layer 7 serving as the photoelectric transducer, by the impurity density 24 formed in a high density at the surface of the substrate 5, that is, the p-layer 10 formed at the surface of the substrate 5 and having the state of distribution of little depth, is on an insignificant level. Thus the absolute amount of effective donors accumulated in an insignificant photoelectric transducer may only be lowered to the extent compared with the case of the conventional device.

In addition, as to the impurity density 21 of the p-layer 6, the impurity density 21 is formed in the depth of the substrate 5. An end of the impurity density 21 is so distributed as to overlap with an end of the photoelectric transducer n-layer 7. At this part also, the density of n-type impurities in the region of the impurity density 23 overlapping one another with the impurity density 21 is so formed as to be extremely low. Hence, the impurity density that may be cancelled in the n-layer 7 serving as the photoelectric transducer, by the impurity density 21 is on an insignificant level. Thus, the absolute amount of effective donors accumulated in the photoelectric transducer may only be lowered to extent compared with the case of the conventional device. When the p-layer 6 and n-layer 7 are overlapped in this way, the impurity density 21 is subject to the following limitations.

Figure 4:
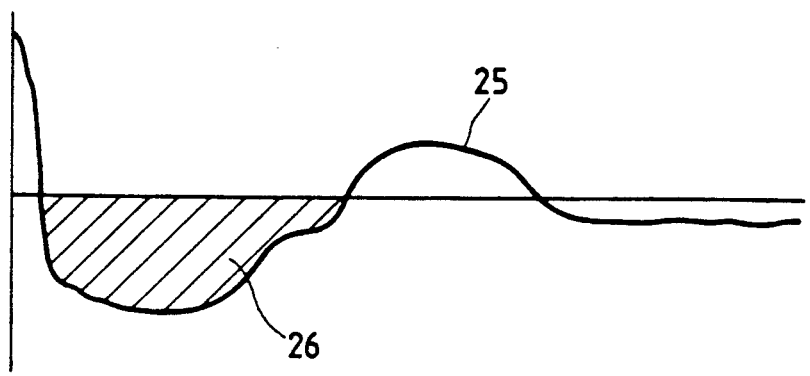
FIG. 4 is a graph to show net impurity densities of the solid-state image pickup device according to the first embodiment of the present invention.

In the first place, when there is no overlap, the solid line 25 of the net impurity density shown in FIG. 3 comes into the shape as shown in FIG. 4. A region is produced such that the region in which the effective donors are accumulated protrudes to the depth of the substrate 5 in the form of a projection. In the photoelectric transducer having such a shape, it can not occur that the net impurity density 26 is cancelled by the impurity density 21, so that a substantial net impurity density becomes larger. As the net impurity density 26 becomes larger, the amount of effective donors becomes larger.

Secondly, when the overlapping region is of little depth, the density in a maximum value a of the impurity density 21 in the overlapping region must be larger than impurity density b of the substrate 5a. In other words, the density a indicates the impurity density of the p-layer 6 at an end portion where the impurity density of the n-layer 7 is distributed. If the value a is smaller than the value b, the impurity density at the depth of the substrate 5 comes into the form of a projection like the solid line 25 of the net impurity density shown in FIG. 4.

If, on the other hand, the value a is extremely larger than the value b, a wall corresponding to the rise of the solid line 25 on the p-side becomes higher. In other words, the potential barrier formed between the n-layer 7 and the substrate 5a becomes higher. A high potential barrier makes it possible prevent the blooming phenomenon by increasing the voltage to be applied to the substrate 5.

When, however, the distribution of the impurity density 21 is so sharp that the region in which the n-layer 7 and the p-layer 6 overlap one another is of little depth, the value a is extremely larger than the value b and also the p-layer 6 has a smaller thickness the net impurity density 26 may be cancelled by the impurity density 25 in a smaller quantity, so that the net impurity density 26 becomes higher. This results in a larger amount of effective donors. A satisfactory effect can also be obtained even when a low voltage is applied to the substrate 5.

The impurity density 23 of the n-layer 7 has its maximum point in the region in which the impurity densities 21 and 24 of the p-layers 6 and 10, respectively, do not overlap at all. Forming the impurity density 23 in this way makes it possible to increase the amount of effective donors.

Thus, the impurity density 23 of the n-layer 7 overlaps one another with the impurity densities 21 and 24 of the p-layers 6 and 10, respectively, only at their end portions. In other words, the impurity density of the p-layer 10 and the impurity density 21 of the p-layer 6 do not overlap one another and both are continuous through the impurity density 23 of the n-layer 7. Formation of such impurity density distributions makes it possible to remarkably increase the amount of effective donors accumulated in the photoelectric transducer n-layer 7.

Figure 27:
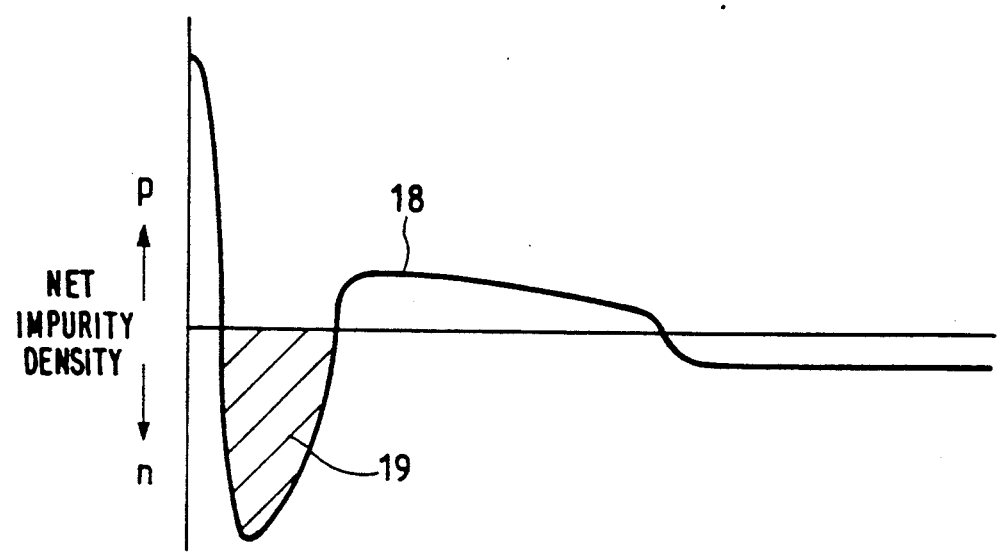
FIG. 27 is a graph to show net impurity densities of the conventional solid-state image pickup device.
Figure 28:
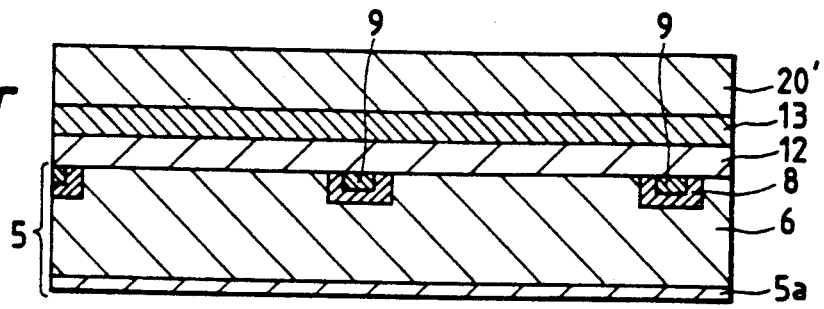
FIGS. 28 to 31 show a flow sheet to illustrate a process for fabricating the conventional solid-state image pickup device.
Figure 29:
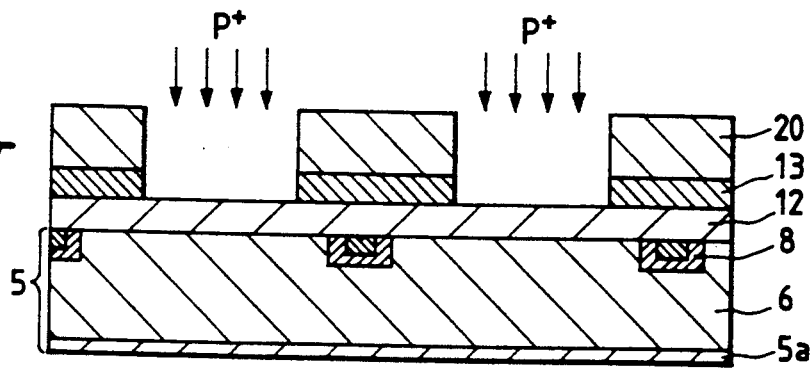
Figure 30:
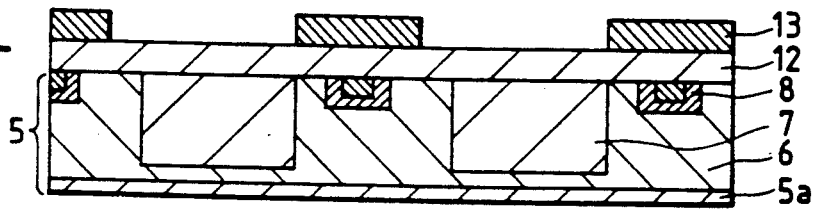
Figure 31:
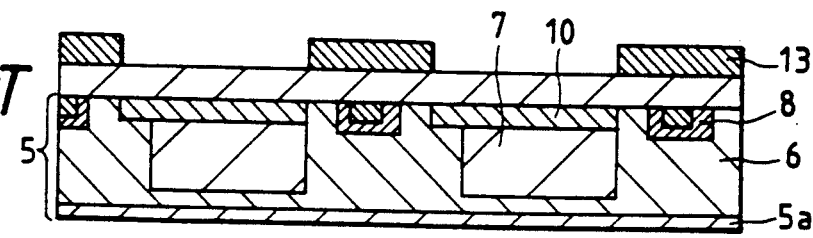

On the other hand, in the net impurity density 25, the area of the shaded portion 26 that indicates the amount of effective donors accumulated in the photoelectric transducer n-layer 7 is larger than the area of the shaded portion 19 (FIG. 27) that indicates the amount in the conventional case.

Hence, the upper limit value of saturation characteristics of the photoelectric transducer can be made larger than that of the conventional one, and the quantity of saturation charges of the solid-state image pickup device, i.e., dynamic range, can be greatly improved.

Here, the substrate 5a has an impurity density of about $10^{15}$ cm$^{-3}$. The p-layer 10 has an impurity density of $10^{18}$ cm$^{-3}$ to $10^{19}$ cm$^{-3}$ and has a diffusion length of 0.5 micron. The p-layer 6 has an impurity density of about $10^{15}$ cm$^{-3}$ and its region starts at a depth of 1.5 microns from the surface of the substrate 5, having a diffusion length of 3.0 microns. The n-layer 7 has an impurity density of $10^{16}$ cm$^{-3}$ to $10^{17}$ cm$^{-3}$ with its diffusion length of 1.8 microns. Therefore the region in which the n-layer 7 and the p-layer 6 overlap one another is 0.3 micron.

Figure 5:
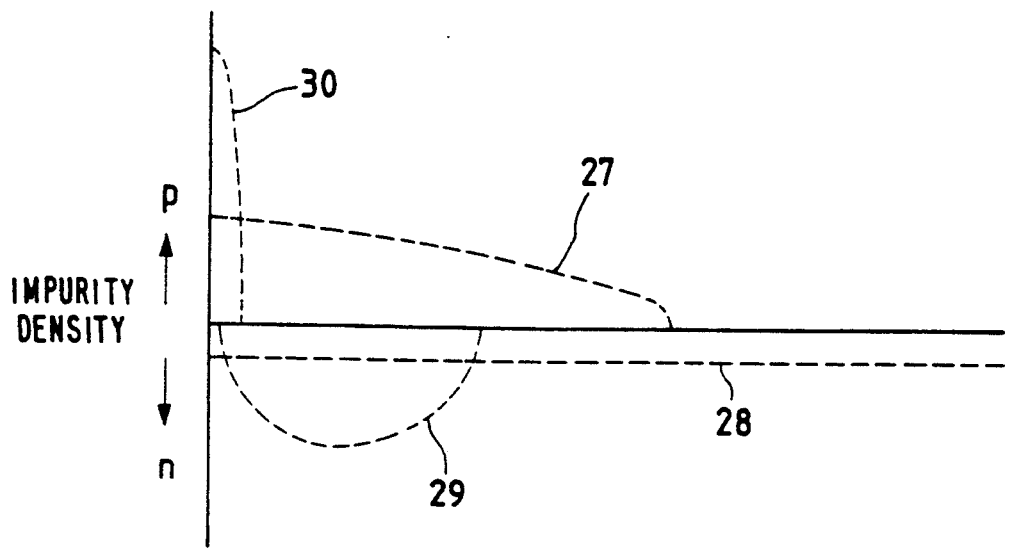
FIG. 5 is a graph to show impurity densities of a solid-state image pickup device according to a second embodiment of the present invention.

FIG. 5 shows impurity densities in a solid-state image pickup device according to a second embodiment.

FIG. 5 shows impurity densities in the substrate, along the line 2—2 passing across the n-layer 7, p-layer 6 and substrate 5a shown in FIG. 1.

Figure 6:
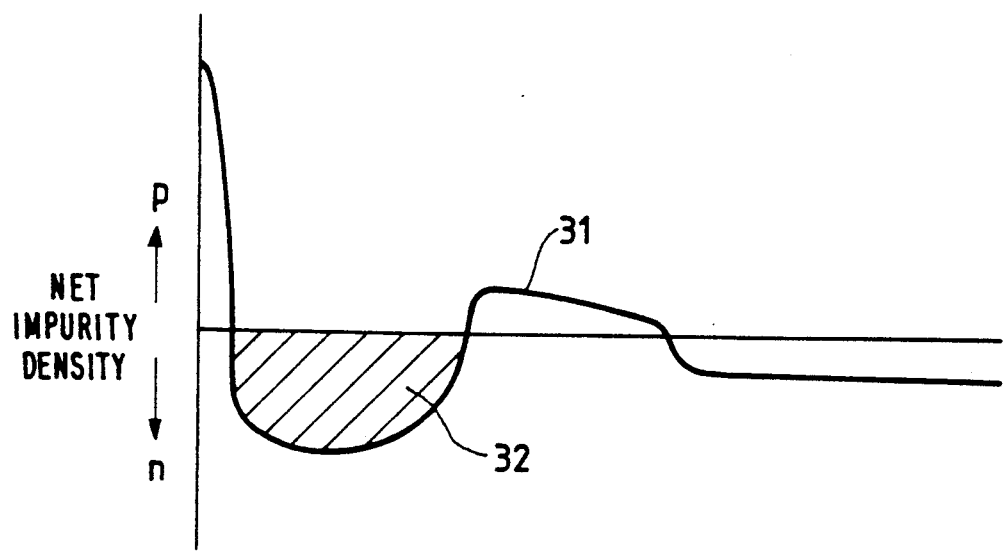
FIG. 6 is a graph to show net impurity densities of the solid-state image pickup device according to the second embodiment of the present invention.

FIG. 6 shows net values of the impurity densities shown in FIG. 5.

In the present invention, as shown in FIG. 1, the cross section of the solid-state image pickup device has the same form as that of the conventional device, but has a different impurity density distribution of the impurity layers formed. This will be more detailed below.

In both FIGS. 5 and 6, the ordinate and abscissa represent the same as those in FIGS. 2 and 3.

Broken lines 27, 28, 29 and 30 in FIG. 5 represent the impurity densities of the p-layer 6, substrate 5a, n-layer 7 and p-layer 10 in FIG. 1, respectively.

A solid line 31 in FIG. 6 represents the net value of each impurity density shown in FIG. 2. The shaded region 32 corresponds to the net impurity density of the photoelectric transducer n-layer 7, showing the amount of effective donors accumulated in the n-layer.

As to the impurity density 29 of the photoelectric transducer n-layer 7, a point at which the density is highest. i.e.. the density is maximum, is present in the interior of the substrate 5. At the surface of the substrate 5, the impurity density of the n-layer 7 is low and the density increases with a depth toward the interior of the substrate 5. Thus, a maximum value of the impurity density of the n-layer 7 is present in the interior of the substrate 5, and the impurity density of the n-layer 7 decreases with increasing depth toward the interior of the substrate beyond the depth at which the density shows the maximum value. Thus, the distribution of the impurity density of the n-layer 7 is the same as that in the first embodiment.

The p-layer 10 is formed at the upper part of the n-layer 7 so that the dark current can be decreased. The impurity density 30 of the p-layer 10 is higher than the density of the n-layer 7, where the layer is so formed that the impurity density is only a little spread toward the interior of the substrate 5. This is also the same as in the first embodiment.

What is different from the first embodiment is that the p-layer 6 is formed in a low density distributed from the surface of the substrate 5 to the depth of the substrate 5, in the same way as the impurity density 15 in the conventional solid-state image pickup device.

More specifically, the impurity density 27 of the p-layer 6 has a maximum value at the surface of the substrate 5. It is distributed in the state that the impurity density spreads to the depth of the substrate 5. The p-layer 6 is formed to have a diffusion depth which is greater than the diffusion depth of the n-layer 7.

The difference in the state of distribution of impurity density between the solid-state image pickup device of the present invention and the conventional one brings about a great difference in the amount of effective donors accumulated in the photoelectric transducer.

More specifically, the amount of effective donors that is represented by the net impurity density 32 can be obtained in the following way: It can be obtained by subtracting the impurity density 30 of the p-layer 10 and the impurity density 27 of the p-layer 6 from a value obtained by adding the impurity density 28 of the substrate 5a to the impurity density 29.

In the conventional solid-state image pickup device, the device is so formed to have the region in which the impurity density of the n-layer 7 is maximum at the surface of the substrate 5 or in the region of little depth corresponding to a depth at which the impurity density of the p-layer 10 for decreasing dark currents is distributed. As a result, the region having a highest impurity density within the n-layer 7 serving as the photoelectric transducer is cancelled by the p-layer 10 formed at the surface of the substrate 5 and having the state of distribution of little depth. This results in a lowering of the absolute amount of effective doners accumulated in the photoelectric transducer. Moreover, since the impurity density of the p-layer 6 is distributed deeply, though in a low density, to the depth of the substrate 5, the impurity density of the n-layer 7 becomes lower as a whole. This also results in a lowering of the absolute amount of effective donors accumulated in the photoelectric transducer.

On the other hand, in the solid-state image pickup device of the present invention, the photoelectric transducer n-layer 7 is so formed as to have an extremely low impurity density at the surface of the substrate 5 or in the region of little depth corresponding to a depth at which the impurity density of the p-layer 10 for decreasing dark currents is distributed. Hence, the impurity density that may be cancelled in the n-layer 7 serving as the photoelectric transducer, by the impurity density 30 formed in a high density at the surface of the substrate 5, that is, the p-layer 10 formed at the surface of the substrate 5 and having the state of distribution of little depth, is on an insignificant level. Thus the absolute amount of effective donors accumulated in an insignificant photoelectric transducer may only be lowered to the extent compared with the case of the conventional device.

In the second embodiment, however, the impurity density 27 of the p-layer 6 is distributed from the surface of the substrate 5 to the depth of the substrate 5. In the first embodiment, the impurity density 21, corresponding to the impurity density 27, of the p-layer 6 is formed in the depth of the substrate 5. An end of the impurity density 21 corresponding to the impurity density 27 is so distributed as to overlap with an end of the photoelectric transducer n-layer 7. Hence, the impurity density that may be cancelled in the n-layer 7 serving as the photoelectric transducer, by the impurity density 21 corresponding to the impurity density 27 is on the level almost out of question, as previously stated.

Compared with this, the second embodiment is the same as the conventional solid state image pickup device in that the p-layer 6 is formed with the impurity density diffused from the surface of the substrate 5. Hence the absolute amount of effective donors accumulated in the photoelectric transducer becomes smaller than that in the first embodiment. However compared with the conventional device, the amount of effective donors may only be lowered to an insignificant extent also in the second embodiment.

In the first embodiment, the impurity density 21 corresponding to the impurity density 27 is subject to the stated limitations when the p-layer 6 and n-layer 7 are overlapped. In the second embodiment, however, they can be formed with ease using a conventional process.

In the net impurity density 31, the area of the shaded portion 26 that indicates the amount of effective donors accumulated in the photoelectric transducer n-layer 7 is larger than the area of the shaded portion 19 (FIG. 27) that indicates the amount in the conventional case.

Hence, the upper limit value of saturation characteristics of the photoelectric transducer can be made larger than that of the conventional one, and the quantity of saturation charges of the solid-state image pickup device can be greatly improved.

Here, the substrate 5a has an impurity density of about $10^{15}$ cm$^{-3}$. The p-layer 10 has an impurity density of $10^{18}$ cm$^{-3}$ to $10^{19}$ cm$^{-3}$ and has a diffusion length of 0.5 micron. The p-layer 6 has an impurity density of about $2\times10^{14}$ cm$^{-3}$ and its region has a diffusion length of 5.5 microns from the surface of the substrate 5. The n-layer 7 has an impurity density of $10^{16}$ cm$^{-3}$ to $10^{17}$ cm$^{-3}$ with its diffusion length of 1.8 microns. Therefore the region in which the n-layer 7 and the p-layer 6 overlap one another is 1.8 micron.

Fabrication of solid-state image pickup devices under conditions as described above can achieve a saturation charge quantity of about $1.2\times10^5$ per picture element, which has been about $4\times10^4$ per picture element in the conventional solid-state image pickup device.

Figure 7:
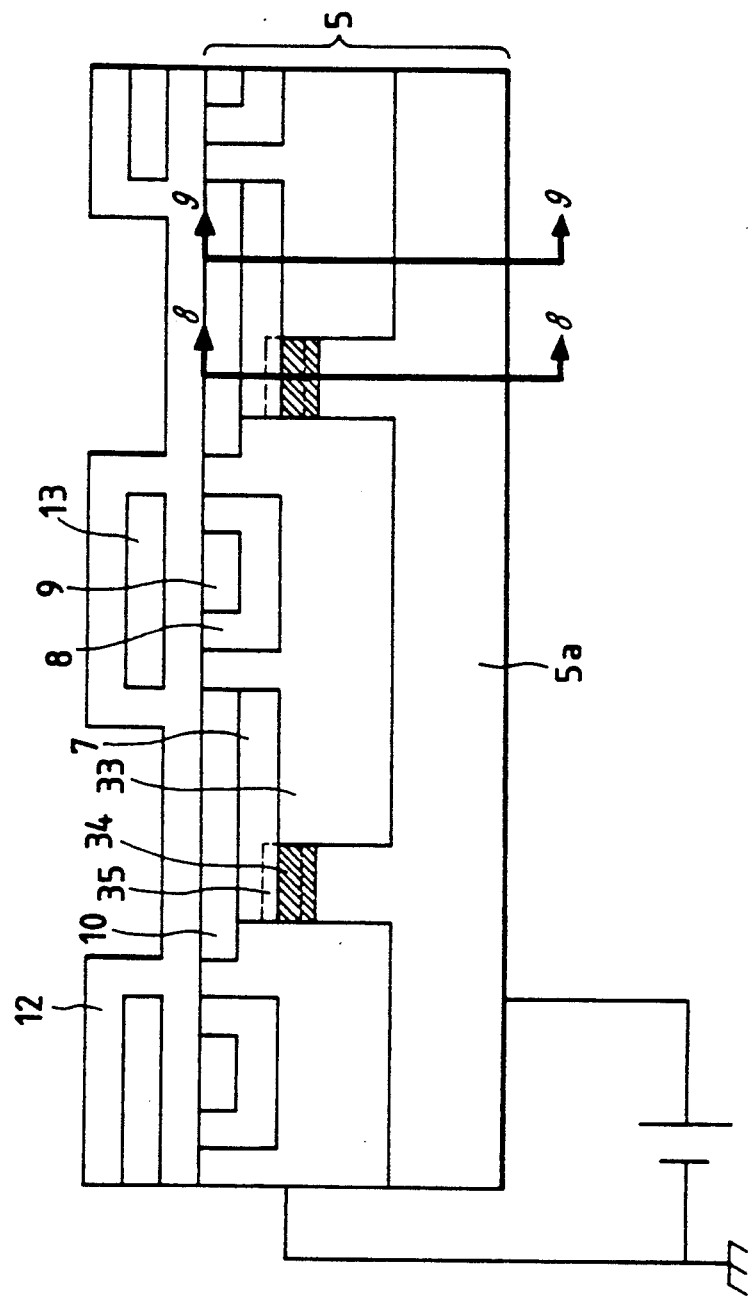
FIG. 7 is a cross section to illustrate a solid-state image pickup device according to a third embodiment of the present invention.

FIG. 7 cross-sectionally illustrates a solid-state image pickup device according to a third embodiment of the present invention.

Figure 25:
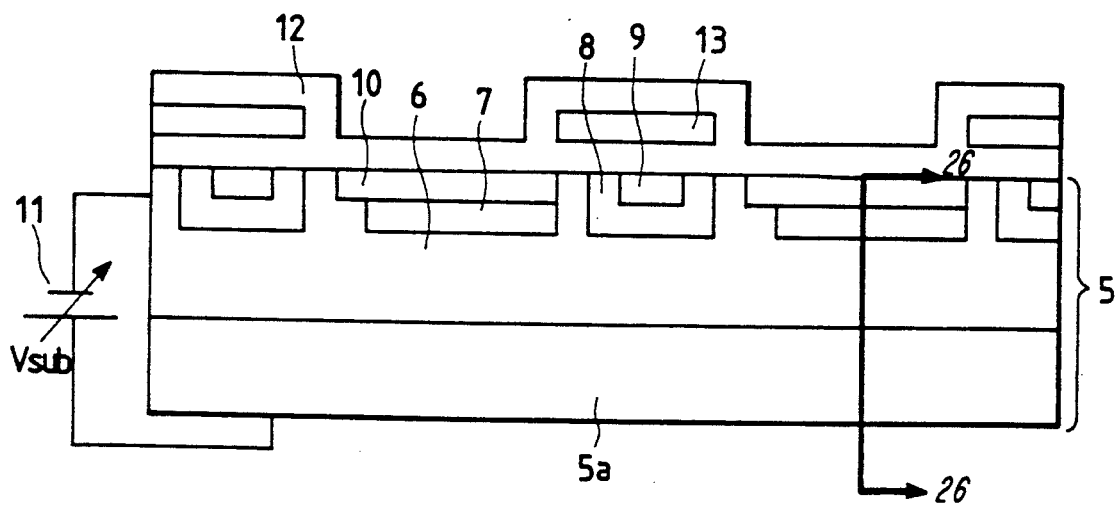
FIG. 25 is a cross section to illustrate the conventional solid-state image pickup device.
Figure 26:
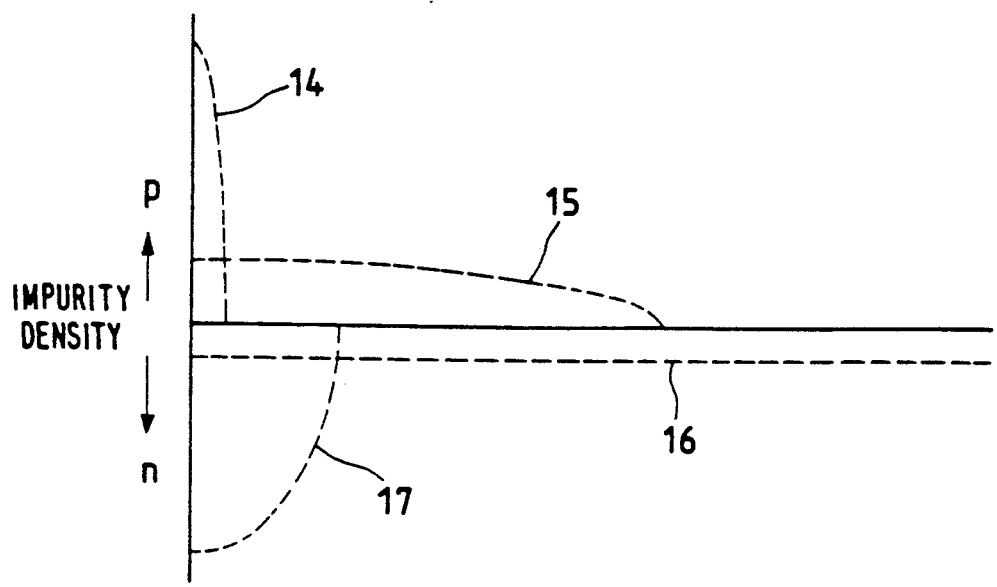
FIG. 26 is a graph to show impurity densities of the conventional solid-state image pickup device.

FIG. 7 is a cross-section of the device having the regions corresponding to those of the solid-state image pickup device shown in the prior art FIG. 25.

In the upper layer portion of an n-type substrate 5, a p-layer 33 having depth and density in given ranges is formed. A region corresponding to part of an n-layer photoelectric transducer 7 is formed in the p-layer 33. A p-layer 8 with a high density is also formed in the p-layer 33. An n-layer 9 that serves as a vertical CCD transfer channel is provided in the p-layer 8. A p-layer 34 with a high density and a small thickness is further formed in contact with the bottom of the photoelectric transducer 7. The p-layer 34 is formed in the n-type substrate 5 at its part positioned between the p-layer 33 and another p-layer 33 adjacent thereto. A high-density p-layer 10 is formed on the photoelectric transducer 7. The p-layer 8 is formed apart from the n-layer 7 and p-layer 10.

On the n-type substrate 5, a vertical CCD transfer electrode 13 is formed in the region from which a given region of the photoelectric transducer 7 at least is extruded, interposing an insulating film 12 comprising SiO$_2$ or the like.

The photoelectric transducer n-layer 7 is formed on the two regions corresponding to the p-layer 33 with a low density and a large thickness and the p-layer 34 with a high density and a small thickness.

Signal charges accumulated in the n-layer 7 are read out to the n-layer 9 and then the signal charges are transferred within the n-layer 9 and in the direction perpendicular to the paper face of the drawing.

The high-density p-layer 10 formed on the photoelectric transducer n-layer 7 is formed so that any dark current caused by an interfacial level of Si-SiO$_2$ can be prevented from occurring.

In the solid-state image pickup device of the present invention as described above, what is different from the conventional solid-state image pickup device is that the photoelectric transducer n-layer 7 is formed at least in contact with the region extending over the two regions corresponding to the p-layer 33 with a low density and a large thickness and the p-layer 34 with a high density and a small thickness.

Here, the substrate 5a used has an impurity density of $10^{15}$ cm$^{-3}$. The p-layer 33 has an impurity density of $10^{15}$ cm$^{-3}$ with its diffusion length of 3 microns. The n-layer 7 has an impurity density of $10^{16}$ cm$^{-3}$ to $10^{17}$ cm$^{-3}$ with its diffusion length of 1.8 microns. The p-layer 10 has an impurity density of $10^{18}$ cm$^{-3}$ to $10^{19}$ cm$^{-3}$ with its diffusion length of 0.5 micron. The p-layer 8 has an impurity density of about $3\times10^{17}$ cm$^{-3}$ with its diffusion length of 1.2 microns. The n-layer 9 has an impurity density of $5\times10^{16}$ cm$^{-3}$ with its diffusion length of 0.8 micron. The p-layer 34 has an impurity density of $4\times10^{15}$ cm$^{-3}$ with its diffusion length of 1.5 microns.

The p-layer 34 is formed at the position of the n-layer 7 serving as the photoelectric transducer, spaced apart from the n-layer 9 serving as the vertical CCD transfer area. The p-layer 34 is formed along a long side of the photoelectric transducer n-layer 7. The p-layer 34 is 3 microns in length extending in the long-side direction. When it is formed in a further extended length in this length along the long side of the photoelectric transducer n-layer 7, it is possible to lower the voltage applied for operating an electronic shutter. In other words, it is possible to lower the pulse voltage to be applied to the substrate 5 so as for the signal charges accumulated in the n-layer 7 to be all released to the substrate 5a.

In the present embodiment, end portions of the photoelectric transducer n-layer 7, and the p-layer 34 which are most distant from the vertical CCD transfer area, n-layer, designated as 9 in the drawing, are on the same line. The same effect can be obtained also when the p-layer 34 is formed in such a way that its end portion extends from the end portion of the n-layer 7 to an adjoining p-layer 33 located in the left side in the drawing. Thus, the positional relationship has an allowance in the formation of the end portions and hence a greater margin can be promised in the manufacture.

On the other hand, if the end portion of the p-layer 34 is recessed from the end portion of the n-layer 7, it follows that the n-layer 7 comes in direct contact with the substrate 5a and therefore no signal charges can be accumulated in the n-layer 7.

The p-layer 34 has a thickness of 1.5 microns in the depth direction of the substrate 5. This thickness influences the values of voltages applied to the n-layer 7 when the electronic shutter of the solid-state image pickup device is operated. More specifically, when the n-layer has a thickness smaller than this thickness, the potential barrier produced between the n-layer 7 and the substrate 5a becomes lower. Hence the voltage to be applied to the substrate 5 can be decreased.

When on the other hand the n-layer 7 is formed in a thickness larger than this thickness, the potential barrier produced between the n-layer 7 and the substrate 5a becomes higher. Hence, the voltage to be applied to the substrate 5 must be increased.

A reverse bias voltage Vsub that causes positive potential in the n-type substrate 5a and negative potential in the p-layer 33 is applied across the p-layer 33 and the n-type substrate 5a.

Figure 8:
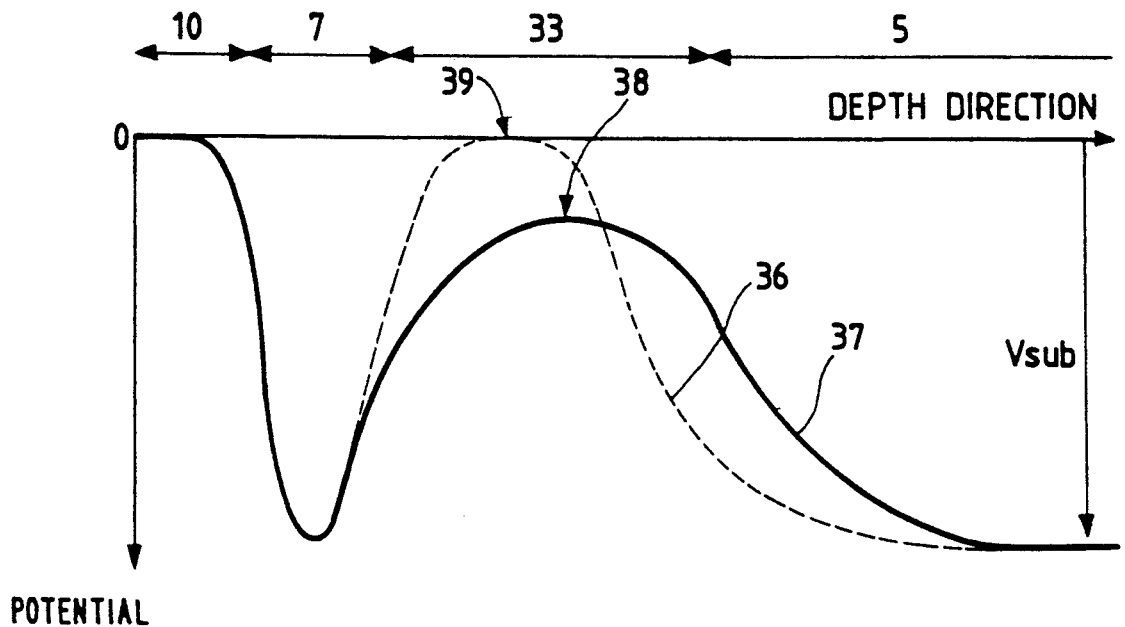
FIG. 8 is a graph of potential distribution to show a blooming phenomenon in the third embodiment of the present invention.
Figure 9:
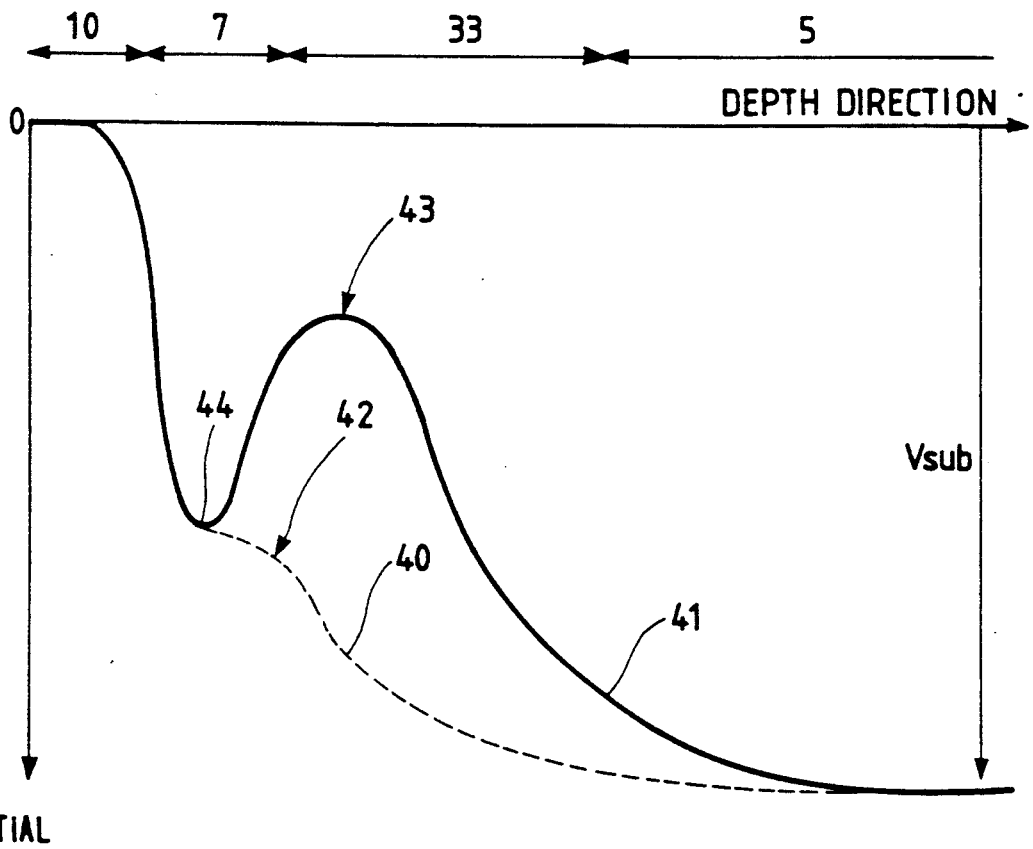
FIG. 9 is a graph of potential distribution to show the operation as an electronic shutter in the third embodiment of the present invention.

FIGS. 8 and 9 show potential distributions along the line 8—8 and 9—9, respectively, shown in FIG. 7, which are formed when a positive voltage Vsub is applied to the n-type substrate 5 in order to prevent the blooming phenomenon.

FIG. 8 is a graph to explain in detail that the solid-state image pickup device of the present invention is effective for decreasing the blooming phenomenon.

In FIG. 8, a broken line 36 represents the potential distribution along the line 8—8 shown in FIG. 7, and a solid line 37 the potential distribution along the line 9—9. Regions 10, 7, 33 and 5 indicate depth-direction thicknesses of the high-density p-layer 10, the photoelectric transducer n-layer 7, the thick, low-density p-layer 33 and the n-type substrate 5a, respectively.

When the Vsub potential has been applied, the value of minimum potential 38 in the thick, low-density p-layer 33 is higher than the value of minimum potential 39 of the thin, high-density p-layer 34.

In the photoelectric transducer n-layer 7, a potential well is formed. Hence, the charges produced in the n-layer 7 and its circumference move along the potential that forms this potential well. As a result, charges are accumulated in the potential well. With a further increase in the charges accumulated to bring about charges having the potential that exceeds the minimum potential 38, the charges become excess and move along the potential distribution of the p-layer 33. As a result, the excess charges are released to the n-type substrate 5a.

The blooming phenomenon is a phenomenon that occurs as a result of incidence of highly luminous light on the photoelectric transducer n-layer 7. More specifically, the light made incident instantaneously produces a large quantity of electrons in the photoelectric transducer. Only a given volume of electrons can be accumulated in the photoelectric transducer. When the electrons thus instantaneously produced are in a large quantity and are more than the volume within which they are accumulated in the photoelectric transducer, the blooming phenomenon is caused by excess electrons flowing into the adjacent vertical CCD transfer channel. Such a phenomenon is called blooming.

As is seen from FIG. 8, the potential distribution in the photoelectric transducer is indicated by two types of distribution corresponding to the broken line 36 and solid line 37 shown in FIG. 8. The electrons formed in the photoelectric transducer n-layer 7 are accumulated in the potential well. Having been accumulated in a large quantity, the electrons flow to the p-layer 33 from the part of n-layer 7, having potential distribution of the lower potential in the two distribution forms of the photoelectric transducer n-layer 7. The minimum potential 38 in the state of distribution as shown by the solid line 37 is lower than the minimum potential 39 of the broken line 36, and hence the electrons flow to the p-layer 33 firstly from the region having the potential distribution shown by the solid line 37.

FIG. 9 is a graph to explain in detail that the solid-state image pickup device of the present invention is effective for achieving-the operation of an electronic shutter.

The operation of an electronic shutter is to release all the signal charges accumulated in the photoelectric transducer n-layer 7 to the n-type substrate 5a. FIG. 9 shows potential distribution in the substrate 5a, examined when the electronic shutter was operated. In other words, the operation of the electronic shutter is to release all the electrons accumulated in the photoelectric transducer n-layer 7 to the substrate 5a. Unless the accumulated electrons are completely released, a state in which charges in a quantity different for each photoelectric transducer unit are accumulated (or left) in the interior is brought about when the electronic shutter is operated. As a result, fixed patterns are produced because of the charges left therein.

In order to operate the electronic shutter, a positive voltage Vsub which is much higher than the case of FIG. 8 is applied to the n-type substrate 5.

In FIG. 9, a broken line 40 and a solid line 41 represent the potential distribution along the line 8—8 and line 9—9, respectively, shown in FIG. 7.

Regions 10, 7, 33 and 5 in FIG. 9 indicate depth-direction thicknesses of the high density p-layer 10, the photoelectric transducer n-layer 7, the thick, low-density p-layer 33 and the n-type substrate 5a, respectively.

When the Vsub potential bas been applied, the minimum potential 42 in the thin, high-density p-layer 34 is higher than the minimum potential 43 of the thick, low-density p-layer 33, and also the minimum potential 42 is lower than the potential 44 of the n-layer 7. Hence, the signal charges accumulated in the photoelectric transducer n-layer 7 move along the potential represented by the broken line 40 indicating a lower potential. At this time, the potential represented by the broken line is lower than the minimum potential 44 in the photoelectric transducer n-layer 7, and hence all the signal charges accumulated in the photoelectric transducer are released to the n-type substrate 5a.

Figure 10:
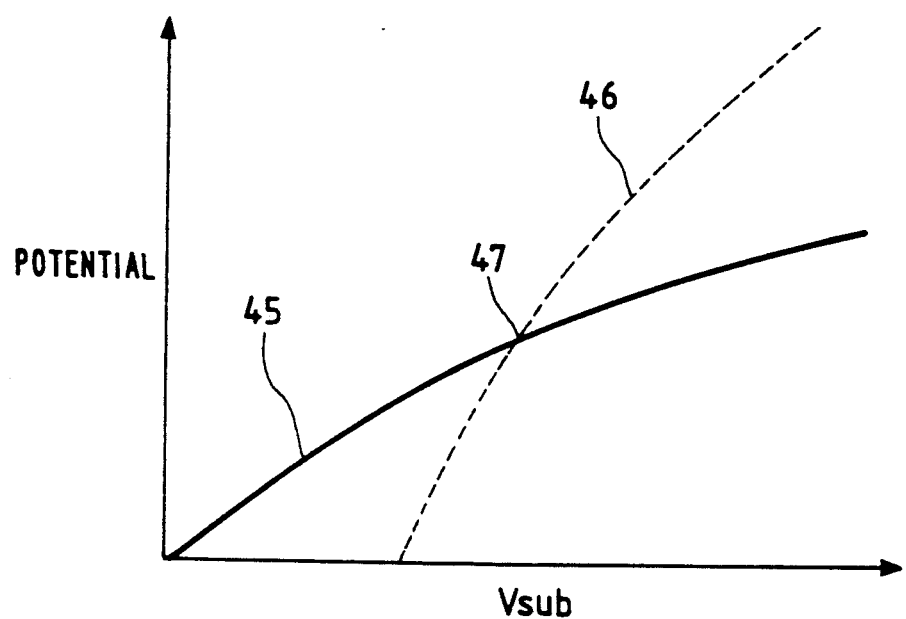
FIG. 10 is a graph to show the relationship between substrate potential and reverse bias voltage in the third embodiment of the present invention.

FIG. 10 is a graph to show the relationship between Vsub and potential to explain the reason for the above occurrence.

In FIG. 10, a solid line 45 and a broken line 46 each show the Vsub voltage dependence of minimum potentials in the thick, low-density p-layer 33 and the thin, high density p-layer 34, respectively.

The solid line 45 indicates that the minimum potential in the p-layer 33 gradually increases with an increase in the Vsub potential.

As for the broken line 46, it indicates that the minimum potential in the p=layer 34 abruptly increases with an increase in the Vsub potential.

This difference results from the fact that, in comparison between the p-layer 33 and the p-layer 34, the impurity density of the p-layer 33 is lower than the impurity density of the p-layer 34 and also the former has a larger thickness than the latter. In other words, the p-layer 34 has on the other hand a higher impurity density and is formed in a smaller thickness.

Figure 11:
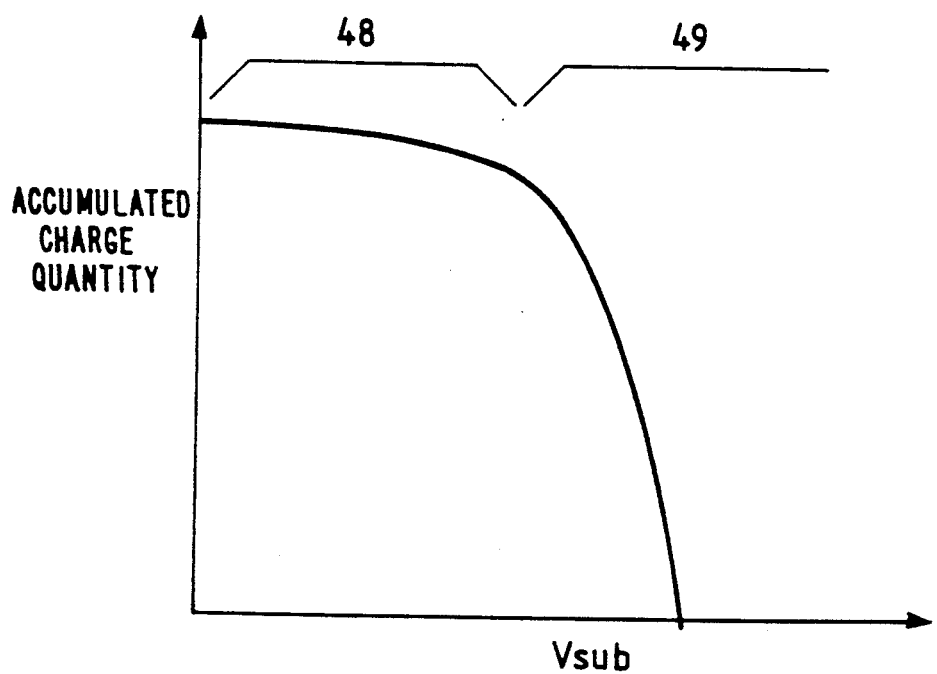
FIG. 11 is a graph to show a maximum quantity of accumulated charges in the third embodiment of the present invention.

Hence, the Vsub potential dependence of the quantity of charges accumulated in the photoelectric transducer n-layer 7 is determined by the solid line 45 when the minimum potential is below the intersection 47 and by the broken line 46 when it is above the intersection 47. More specifically, the quantity of charges accumulated in the photoelectric transducer has a Vsub potential dependence as shown in FIG. 11. As is seen therefrom, a while during which the charges are accumulated in the photoelectric transducer, i.e., the state as shown in FIG. 8 corresponds to a region 48 shown in FIG. 11.

When signal charges are released by operating the electronic shutter, it is operated in the state as shown in FIG. g, i.e.. the state in which a higher voltage than that of a solid line shown in FIG. 11 is applied. By doing so, the photoelectric transducer having a high saturated charge quantity can be operated as the electronic shutter at a low Vsub pulse voltage.

Thus, in order to prevent occurrence of the blooming, the photoelectric transducer should preferably be operated in a region like the region 48 in which the changes in maximum quantity of accumulated charges have a mild Vsub potential dependence with respect to the Vsub potential. Use thereof in such a region enables easy control of Vsub potential of camera-combined VTRs. Use thereof in such a Vsub potential region also makes it possible to lessen the decrease in the maximum quantity of charges accumulated in photoelectric transducers.

On the other hand, when the electronic shutter is operated, the photoelectric transducer should preferably be used in a region like the region 49 in which the changes in maximum quantity of accumulated charges have a sharp Vsub potential dependence with respect to the Vsub potential.

This is because the potential at which the electronic shutter is operated is attained by further adding a clock voltage to the potential applied when the blooming is prevented from occurring.

In the solid-state image pickup device of the present invention, the electronic shutter can be operated at a voltage lower than the clock voltage applied when an electronic shutter is operated in the conventional solid-state image pickup device.

More specifically, when the electronic shutter is operated in the conventional solid-state image pickup device, the clock voltage applied is 30 V. On the other hand, in the solid-state image pickup device according to the third embodiment, the electronic shutter can be operated at a voltage as low as 18 V.

Thus, the thick, low-density p-layer 33 and the thin, high density p-layer 34 may be formed in contact with the photoelectric transducer n-layer 7, so that the Vsub potential of a video camera for preventing the blooming can be controlled with ease and also the maximum quantity of charges accumulated in the photoelectric transducer (i.e., saturation charge quantity) can be increased. The operation of the electronic shutter can also be achieved at a low clock voltage.

The p-layer 34 with a high-density and a small thickness may be further formed in such a way that its part overlaps in the photoelectric transducer n-layer 7 as shown by a broken line 35 in FIG. 7. That is to say, its formation at the position as shown by the broken line 35 brings about a substantial reduction of the thickness of the n-layer 7 coming into contact with the thin, high-density p-layer 34. Hence, when the signal charges of the photoelectric transducer are read out, the photoelectric transducer n-layer 7 is brought into a depleted state. As a result, the potential distribution produced there becomes deeper on the side of read-out and hence the occurrence of residual images can be prevented with greater ease.

Now, regarding the solid-state image pickup device shown in FIG. 7, its driving method will be described with reference to FIGS. 8 and 9.

In the device shown in FIG. 7, the p-layer 8 is electrically grounded. A positive voltage is applied to the substrate 5. Hence, the interface between the p-layers 8, 33 and 34 and the substrate 5a is brought into the state of a reverse bias. As previously described, FIG. 8 is the graph in which the potential distribution in the period during which signal charges are accumulated at this time is shown as potential distribution along the lines 8—8 and 9—9 in FIG. 7.

In this period, the minimum potential 38 of the p-layer 33 is deeper than the minimum potential 39 of the p-layer 34. Hence the electrons that have become excess in the photoelectric transducer n-layer 7 must move along the minimum potential 38 and be released to the substrate 5a. For this purpose, a given voltage may be applied to the substrate 5.

On the other hand, FIG. 9 is the graph in which the potential distribution in the period during which the electronic shutter is operated is shown as potential distribution along the lines 8—8 and 9—9 in FIG. 7.

In this period, a voltage much higher than that in the period during which signal charges are accumulated must be applied to the substrate 5. Application of much higher voltage to the substrate 5 makes it possible for all the signal charges accumulated in the n-layer 7 to be released to the n-type substrate 5a. For this purpose, the minimum potential 42 of the p-layer 34 must be set to have a higher potential than the maximum potential 44 of the n-layer 7.

The p-layer 33 may be made to have a low density and be large in its thickness of distribution and also the p-layer 34 may be formed in a high density to the depth, so that the electronic shutter can be operated at a voltage lower than the conventional case. At this time, the potential of the minimum potential 43 of the p-layer 33 is lower than that of the minimum potential 42 of the p-layer 34.

In other words, the minimum potential 43 of the p-layer 33 can surpass the minimum potential 42 of the p-layer 34 with an increase in the Vsub potential applied to the substrate 5.

Thus, the electronic-shutter can be operated even with application of a low potential to the substrate 5.

A fourth embodiment of the solid-state image pickup device according to the present invention will be described below with reference to FIGS. 12 and 13.

Figure 12:
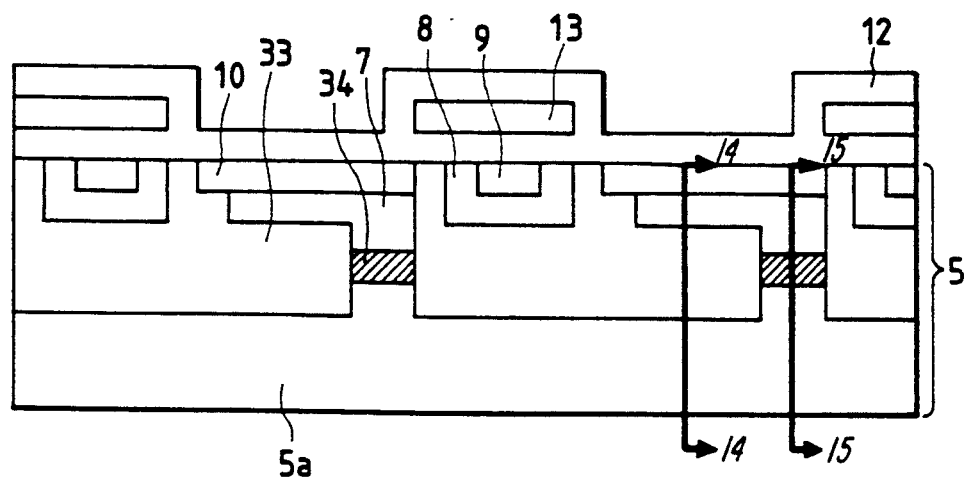
FIG. 12 is a cross section to illustrate a solid-state image pickup device according to a fourth embodiment of the present invention.

FIG. 12 is a cross section along the line 25—25 of the prior art device (FIG. 24).

In the upper layer portion of an n-type substrate 5, a p-layer 33 having depth and density in given ranges is formed. A region corresponding to part of an n-layer photoelectric transducer 7 is formed in the p-layer 33. A p-layer 8 with a high density is also formed in the p-layer 33. An n-layer 9 that serves as a vertical CCD transfer channel is provided in the p-layer 8. A p-layer 34 with a high density and a small thickness is further formed in contact with part of the bottom of the photoelectric transducer 7. The p-layer 34 is formed in the n-type substrate 5 at its part positioned between the p-layer 33 and another p-layer 33 adjacent thereto. A high-density p-layer 10 is formed on the photoelectric transducer 7. The p-layer 8 is formed apart from the n-layer 7 and p-layer 10.

On the n-type substrate 5, a vertical CCD transfer electrode 13 is formed in the region from which a given region of the photoelectric transducer 7 at least is extruded, interposing an insulating film 12 comprising $SiO_2$ or the like.

In this embodiment, what is different from the first embodiment is that the p-layer 34 with a high density and a small thickness is formed on the read-out side of the p-layer 8 serving as a vertical CCD transfer channel.

More specifically, the part coming into contact with the thin, high-density p-layer 34 within the photoelectric transducer n-layer 7 is formed in a depth a little larger than the part coming into contact with the p-layer 33 having a low density and a large thickness. The photoelectric transducer n-layer 7 has a shape of a hook, at the end of the shorter side of which the p-layer 34 is formed. This constitution brings about an increase in potential on the read-out side of the photoelectric transducer when the photoelectric transducer n-layer 7 has been depleted. Hence, the charges in the photoelectric transducer can move with ease at the time of read-out. It therefore becomes easier to prevent residual images from occurring.

Figure 13:
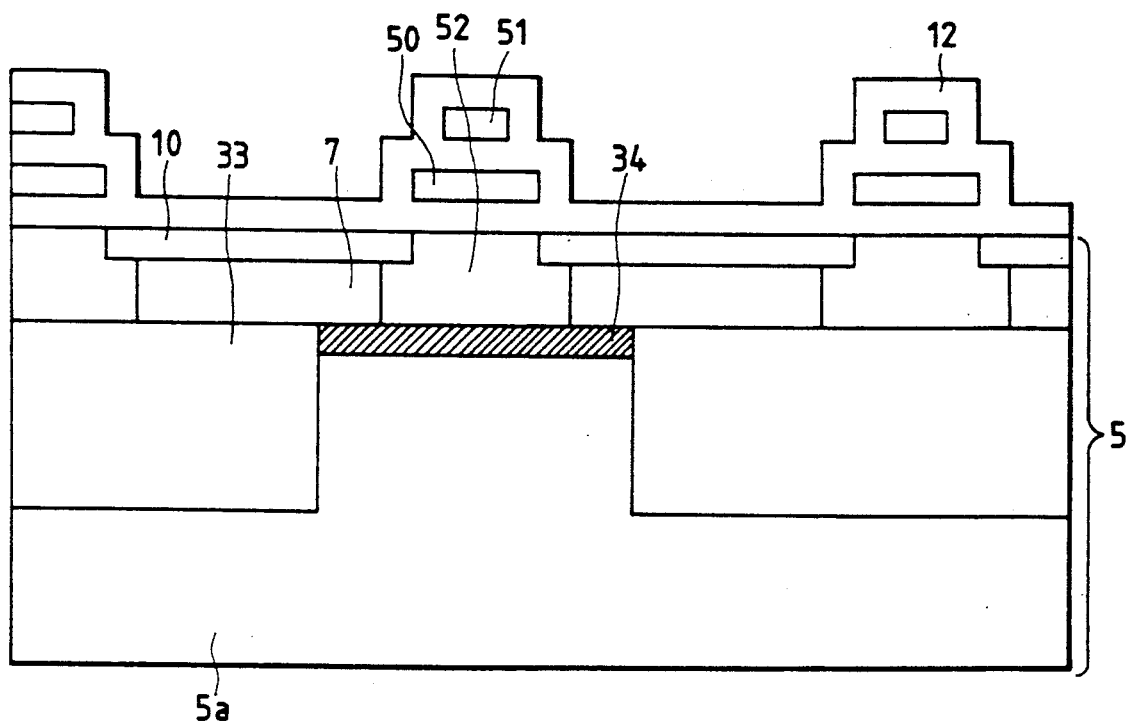
FIG. 13 is another cross section to illustrate the solid-state image pickup device according to the fourth embodiment of the present invention.

FIG. 13 is a cross section along the line 13—13 of the prior art device (FIG. 24).

In the upper layer portion of the n-type substrate 5, a p-layer 33 having depth and density in given ranges is formed. A region positioned between the p-layer 33 and its adjacent p-layer 33 defines part of the n-type substrate 5. A p-layer 34 is formed in the n-type substrate 5 at the position held between the p-layer 33 and its adjacent p-layer 33. An n-layer 7 serving as a photoelectric transducer is continuously formed on each partial region of the p-layer 33 and p-layer 34. A separating p-layer 52 is formed between the photoelectric transducers adjacent one another.

In comparison of the present invention of this embodiment with the first and second embodiments, the p-layer 8 formed in the p-layer 33 and the n-layer 9 serving as a transfer channel formed in the p-layer 8 are not provided in this embodiment.

The p-layer 34 with a high density and a small thickness is formed in contact with part of the bottom of the photoelectric transducer 7. A high-density p-layer 10 is formed on the photoelectric transducer n-layer 7.

On the n-type substrate 5, a vertical CCD transfer electrode 50 is formed in the region from which a given region of the photoelectric transducer 7 at least is extruded, interposing an insulating film 12 comprising SiO₂ or the like. Another vertical CCD transfer electrode 51 is also fromed interposing the insulating film 12.

In regard to the p-layer 34 with a high density and a small thickness, one layer is formed at the separating part between a photoelectric transducer and its adjacent photoelectric transducer. In other words, the p-layer 34 is formed in common to two photoelectric transducers.

With this constitution, the number for the formation of the thin, high-density p-layer 34 ca be reduced to the half of the number of photoelectric transducers. The thin, high-density p-layer 34 coming into contact with the photoelectric transducer n-layer 7 can also be made to have a smaller area, and hence it becomes easy to prevent occurrent of the blooming.

Figure 14:
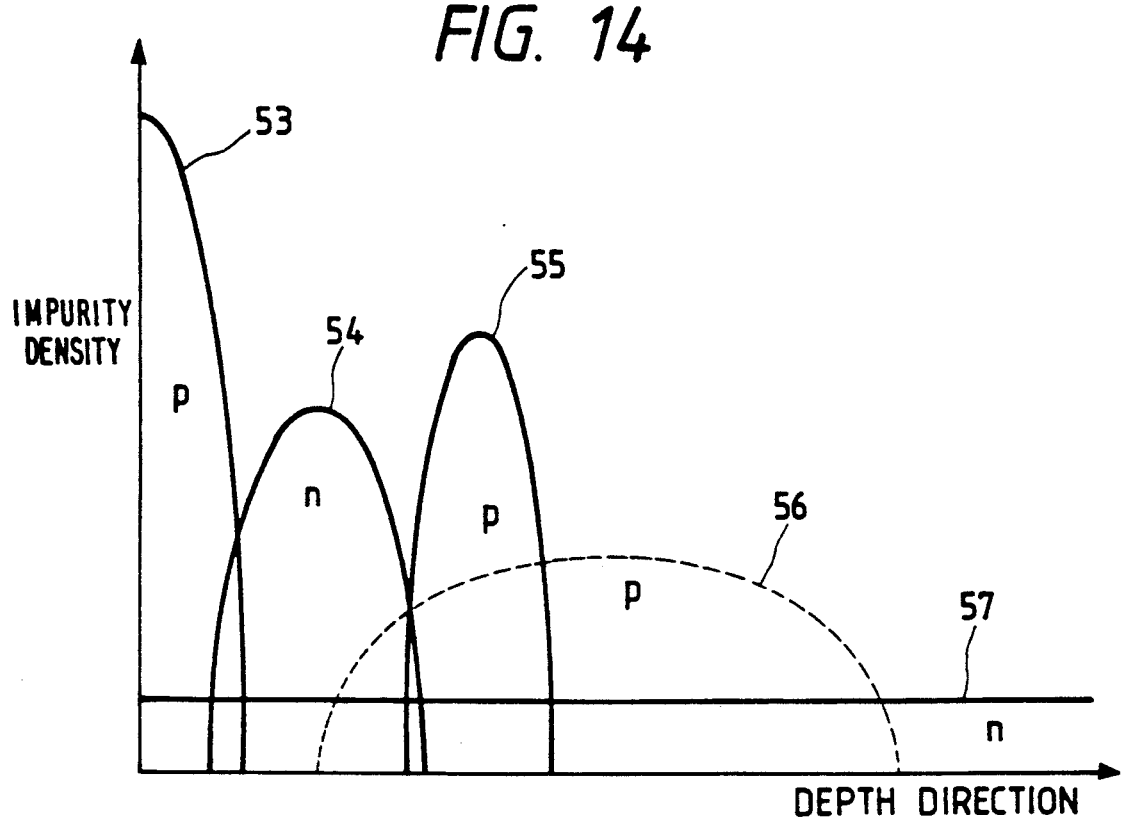
FIG. 14 is a graph to show impurity densities of the solid-state image pickup device according to the fourth embodiment of the present invention.

FIG. 14 shows density distribution of impurity atoms present in the thickness direction along the lines 14—14 and 15—15 in FIG. 12. The numerals 53, 54, 55, 56 and 57 denote impurity densities of the high-density p-layer 10, the photoelectric transducer n-layer 7, the thin, high-density p-layer 34, the thick, low-density p-layer 33 and the n-type substrate 5a, respectively.

In order to form the p-layer 34 to give a layer with a high density and a small thickness, having the impurity density 55, the impurity density 54 of the photoelectric transducer n-layer 7 is so formed as to have a maximum value of impurity atom density in a more interior part from the surface of the substrate 5. With such structure, it becomes possible to lessen the decrease in net impurity density in the photoelectric transducer n-layer 7. Hence, the characteristics of the photoelectric transducer can not be deteriorated. At this time, the impurity density 56 of the thick, low-density p-layer 33 may also be made to have the structure that it has a maximum value of impurity atom density in a more interior part from the surface of the substrate 5 as in the case of the thin, high-density p-layer 34. With such structure, the independence between the impurity density 56 of the thick, low-density p-layer 33 and the impurity density 55 of the thin, high-density p-layer 34 can be kept with ease to make it easier to control impurity densities.

Formation of the structure as described above can be achieved by carrying out ion implantation of impurities such as boron at an accelerating energy of 200 keV or more when the thin, high-density p-layer 34 is formed.

Figure 15:
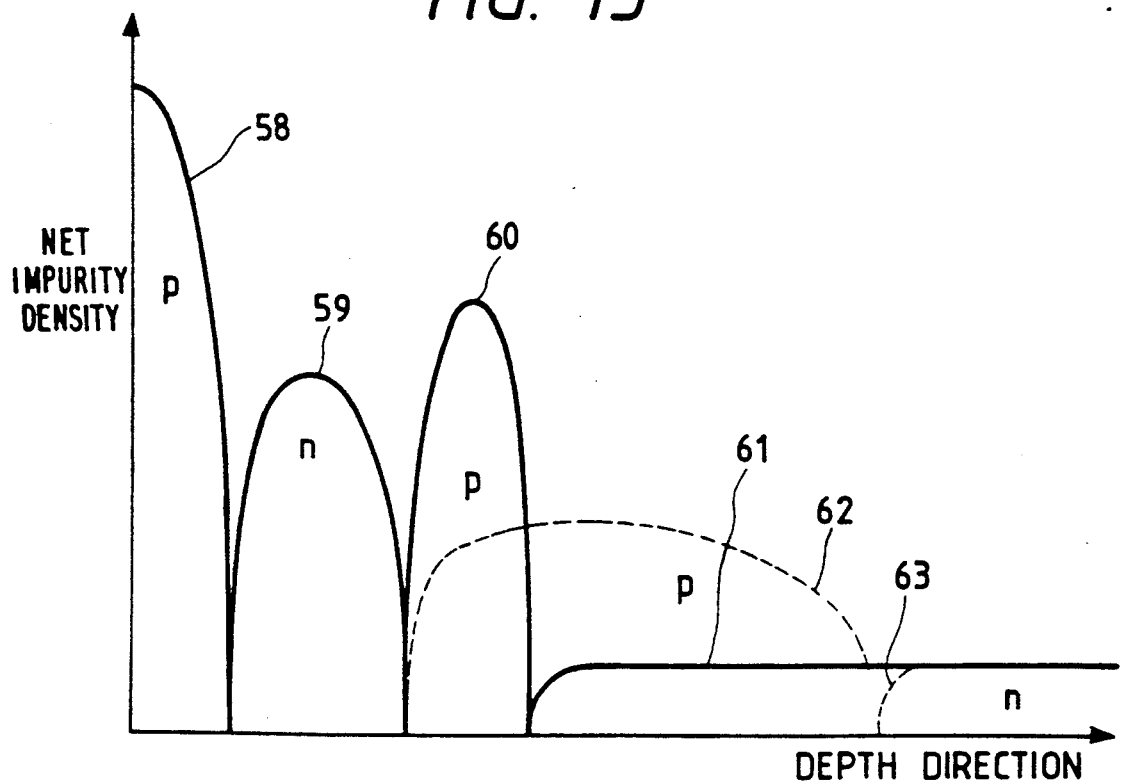
FIG. 15 is a graph to show net impurity densities of the solid-state image pickup device according to the fourth embodiment of the present invention.

The net impurity density distribution in the circumference of the photoelectric transducer thus formed is as shown in FIG. 15. The numerals 58, 59, 60 and 61 denote net impurity densities of the high-density p-layer 10, the photoelectric transducer n-layer 7, the thin, high-density p-layer 34 and the n-type substrate 5a, respectively. The numerals 62 and 63 denote net impurity densities of the thick, low-density p-layer 33 and the n-type substrate 5a, respectively. At this time, the thick, low-density p-layer 33 may also be formed by ion implantation at an accelerating energy of 200 keV or more as in the case of the thin, high-density p-layer 34, thereby making it easier to control impurity densities.

FIGS. 16 to 19 cross-sectionally illustrate a flow sheet for fabricating the solid-state image pickup device according to the first embodiment.

In the main surface of the substrate 5 with a specific resistance of 20 Ω.cm, p-type impurity boron is ion-implanted to cover substantially the whole surface. Here, the boron is ion-implanted in an amount of about $5 \times 10^{11}/cm^2$. As a result of this ion implantation, boron is led into the surface of the substrate 5.

Thereafter, the substrate 5 is subjected to a heat treatment to form the p-layer 6.

In the solid-state image pickup device according to the second embodiment previously described, ions are led into the surface of the substrate 5 and then thermally diffused so that its impurity density can be distributed over a wide range. More specifically, ion-implanted boron is diffused by a high-temperature heat treatment to form the p-layer 6.

The p-layer 6 is so formed that its impurity density can be distributed over a wide range within the region of the p-layer 6, since ions are led into the substrate surface and then ions must be diffused over a wide range by a high-temperature heat-treatment.

Thereafter, using conventional photolithography, a resist pattern is formed on the region other than the region that serves for the vertical CCD transfer channel. Using the resist pattern as a mask, boron is ion-implanted to form the p-layer 8.

Thereafter, the above resist pattern is removed by dry etching using an oxygen type gas. Using again photolithography, a resist pattern is also formed on the region other than the region in which the n-layer 9 within the p-layer 8 serving as the vertical CCD transfer channel is formed.

Figure 16:
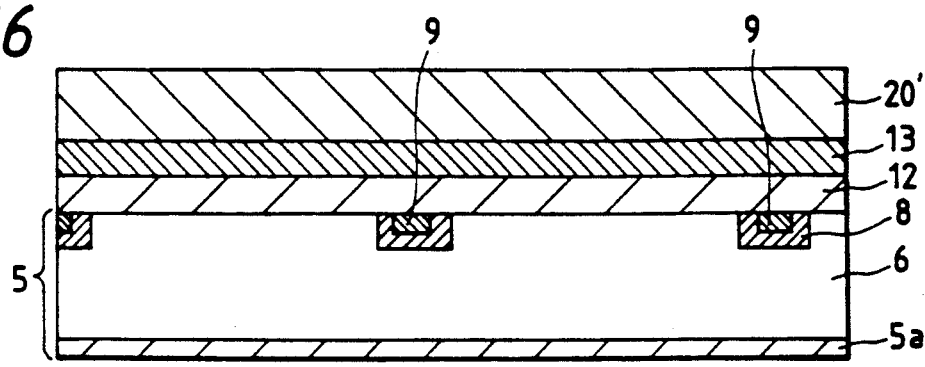
FIGS. 16 to 19 show a flow sheet to illustrate a first embodiment of the process for fabricating the solid-state image pickup device of the present invention.

Using the resist pattern as a mask, phosphorus is ion-implanted to form the n-layer 9. Thereafter, the resist pattern is removed by oxygen-type dry etching. Next, the insulating film 12 is formed on the main surface of the substrate 5 by thermal oxidation. Here, an oxide film is used as the insulating film 12. On the insulating film 12, an electrode material serving as the vertical CCD transfer electrode 13 is further formed. A resist 20' for a resit pattern is further coated on the electrode material to form a resist pattern 20 (FIG. 16).

Next, the resist on the region other than the region broader than the region serving for the transfer electrode 13, i.e., on the region in which the n-layer 7 serving as the photoelectric transducer is formed, is removed by conventional photolithography to form a resist pattern 20. Using the resist pattern 20 as a mask, the electrode material is dry-etched until the insulating film 12 is uncovered.

Figure 17:
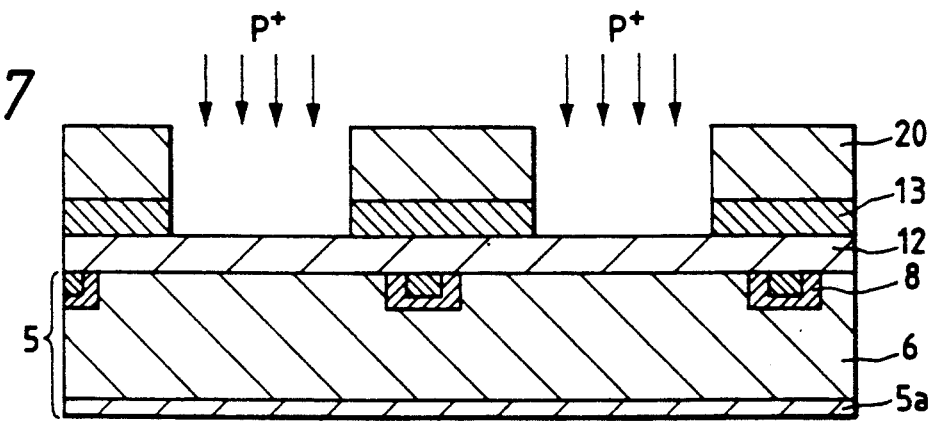
Figure 18:
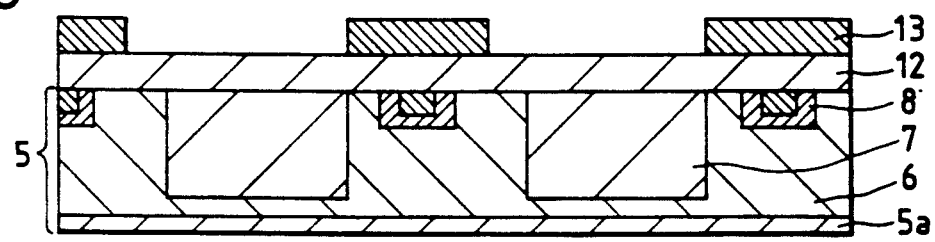

Next, using the resist pattern 20 as a mask and also making the insulating film 12 serve as a protective film, phosphorus is ion-implanted. The n-layer 7 serving as the photoelectric transducer is formed as a result of this ion implantation (FIGS. 17 to 18). Here, the ion implantation of phosphorus is carried out at an accelerating energy of 360 keV to 800 keV and in an amount of about $2 \times 10^{12}/cm^2$ to $3.4 \times 10^{12}/cm^2$.

As is evident from the above, it is unnecessary to increase the quantity of the impurities led into the photoelectric transducer, which has been done in the prior art. To increase the quantity of impurities necessarily brings about a considerable loss of time. Thus, in the process of the present invention, there can be no lowering of throughput at the time of the fabrication of solid-state image pickup devices.

It is also unnecessary to diffuse the implanted impurities into the depth of the substrate by a high-temperature heat treatment so that the area of the photoelectric transducer can be increased. Hence, no defects can occur in the substrate, which may be caused by the high temperature heat treatment. Since the impurities are diffused from other diffusion-layer, it is still also unnecessary to make control so as to attain the desired impurity density. There also is no possibility that the photoelectric transducer is diffused and spread as a result of the high-temperature heat treatment and consequently diffused also to the vertical CCD transfer channel or the gap region between the transfer channel and the photoelectric transducer electrode 13.

As for the positional relationship between the end portion of the photoelectric transducer and the end portion of the vertical CCD transfer electrode, it can not become difficult to control the position of the diffusion layer as a result of the high-temperature heat treatment. Hence the positional relationship between the both can be attained with ease. This can prevent the blooming phenomenon from occurring in the solid-state image pickup device, and also can stop the deterioration of picture quality that may be caused by a lowering of saturation characteristics.

Thereafter, the resist pattern 20 is removed. On the surface of the substrate 5, an electrode material is formed with a region broader than the insulating film 12 and transfer electrode 13. Next, a resist pattern is formed on the region other than the region in which the transfer electrode 13 is formed. Using this resist pattern as a mask, the electrode material is dry-etched. Through the above process, the transfer electrode 13 is formed (FIG. 18).

At this time, the transfer electrode 13 must be provided also on the gap region between the n-layer 7, i.e., the photoelectric transducer from which electrons are read out to the vertical CCD transfer channel, and the p-layer 8. For this purpose, since in the dry etching carried out when the transfer electrode 13 is formed a side wall end of the n-layer 7 serving as the photoelectric transducer is originally on the same line with a side wall end of the transfer electrode 13, one side wall end of the transfer electrode 13 is shortened to be formed in the desired length.

Figure 19:
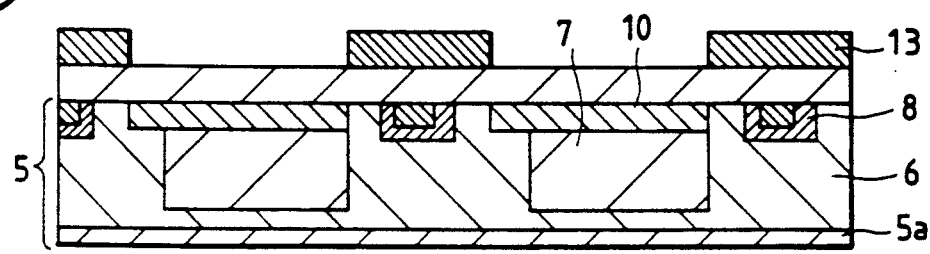

Next, using this transfer electrode 13 and a resist as masks, boron is ion-implanted. The p-layer 10 for preventing dark current is thus formed on the n-layer 7 (FIG. 19).

An example of n-type photoelectric transducers has been described here, but of course the same effect can be obtained also in the case of p-type photoelectric transducers.

The same effect can be obtained of course also when the polarity of the conductivity type is set reverse and the polarity of applied voltage is set reverse.

Also as a matter of course, implanting ion species are by no means limited to those set out herein.

FIGS. 20 to 23 cross-sectionally illustrate a flow sheet for fabricating the solid-state image pickup device according to the third embodiment previously described.

On the main surface of the n-type substrate 5, a resist pattern is formed on its region other than the region that serves for the p-layer. More specifically, the resist pattern is formed on the substrate 5 corresponding to the region of the thin, high-density p-layer 34 formed beneath the photoelectric transducer. Next, using the resist pattern as a mask, p-type impurity boron is ion-implanted to cover substantially the whole surface of the substrate 5.

Thereafter, the resist pattern is removed by oxygen-type dry etching.

Figure 20:
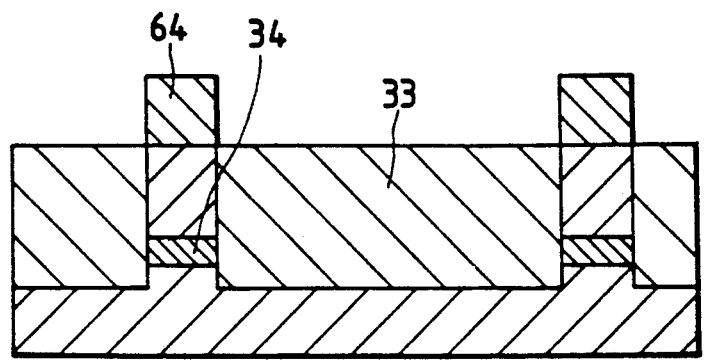
FIGS. 20 to 23 show a flow sheet to illustrate a second embodiment of the process for fabricating the solid-state image pickup device of the present invention.

Next, a resist pattern 64 is afresh formed on the region serving for the p-layer 33. More specifically, the resist pattern 64 is formed on the substrate 5 except its region for the thin, high-density p-layer 34 formed beneath the photoelectric transducer. Next, using this resist pattern 64 as a mask, p-type impurity boron is ion-implanted into the substrate 6 (FIG. 20).

Thereafter, the resist pattern 64 is removed by oxygen-type dry etching.

In the above two steps of boron ion implantation, the order of the implantation may be exchanged.

At this time, if the end portions of the diffusion layers of p-layer 33 and p-layer 34 overlap one another, an increase in the impurity density at the overlapping part and also an increase in thickness at that part may be brought about. Hence the overlapping part is not contributory to the releasing of signal charges to the substrate.

If on the other hand the diffusion-layers of p-layer 33 and p-layer 34 are formed without overlap of their end portions, the density of p-type impurities at the non-overlapping gap portion becomes lower. This results in a lowering of the saturation charge quantity or a lowering of the Vsub voltage to be applied.

Thereafter, a resist pattern is formed by photolithography on the region other than the region serving for the vertical CCD transfer channel. Using the resist pattern as a mask, boron is ion-planted to form the p-layer 8.

Thereafter, the resist pattern is removed by dry etching using an oxygen-type gas. Using again photolithography, a resist pattern is also formed on the region other than the region in which the n-layer 9 within the p-layer 8 serving as the vertical CCD transfer channel is formed.

Using the resist pattern as a mask, phosphorus is ion-implanted to form the n-layer 9.

Thereafter, the resist pattern is removed by oxygen-type dry etching.

Next, the insulating film 12 is formed on the main surface of the substrate 5 by thermal oxidation. Here, an oxide film is used as the insulating film 12.

The thickness of this oxide film must be controlled in a high precision since the oxide film is used as a mask when the photoelectric transducer is formed by ion implantation in the subsequent step.

On the insulating film 12, an electrode material serving as the vertical CCD transfer electrode 13 is further formed.

Figure 21:
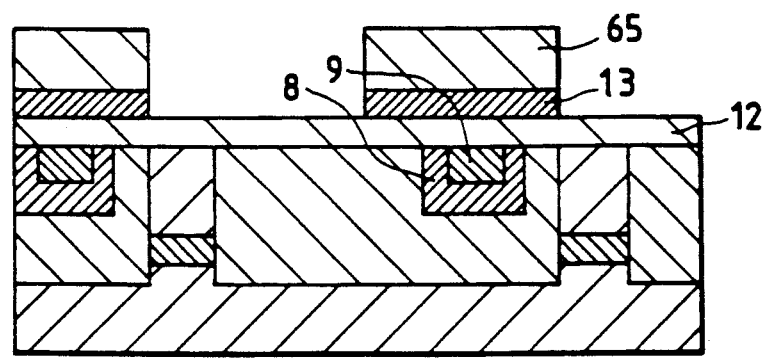

A resist pattern 65 is further formed on the region other than the region broader than the region serving for the transfer electrode 13. Using the resist pattern 65 as a mask, the electrode material is dry-etched until the insulating film 12 is uncovered (FIG. 21).

Figure 22:
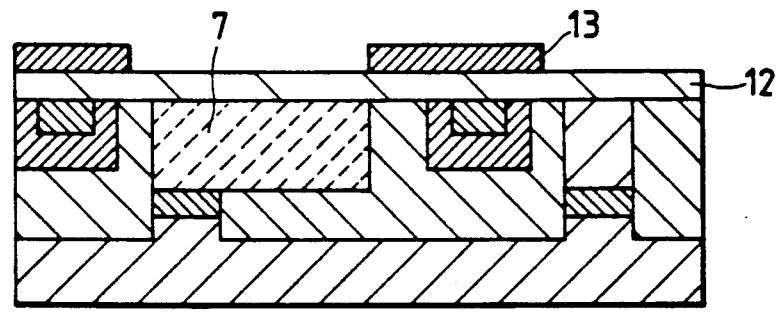

Next, using the resist pattern 65 as a mask and also making the insulating film 12 serve as a protective film, phosphorus is ion-implanted. The n-layer 7 serving as the photoelectric transducer is formed as a result of this ion implantation (FIG. 22).

The p-layer 7 has impurity density distributed in such a way that the density is high in the region formed in the substrate 5 and is low in the region formed in the p-layer 33. Namely, the impurity density of the photoelectric transducer n-layer 7 formed in the substrate is determined by the sum of the density of n-type impurities of the substrate 5 and the density of ion-implanted n-type impurities. On the other hand, as to the photoelectric transducer n-layer 7 formed in the p-layer 33, its impurity density is determined by the sum of the density of n-type impurities of the p-layer 33 and the density of ion-implanted n-type impurities.

In this way, regions having different impurity densities are formed in one photoelectric transducer n-layer 7.

The thin, high-density p-layer 34 is so controlled as to be formed at the bottom of the diffusion-layer of n-layer 7 serving as the photoelectric transducer.

In the fourth embodiment of the solid-state image pickup device as previously described, the thin, high-density p-layer 34 is formed on the side of the transfer electrode 13.

In such an instance also, the region in which the p-layer 34 and the n-layer 7 overlap one another has impurity density corresponding to the sum of the impurity density of the n-layer 7 and that of the impurity density of the p-layer.

Here, the photoelectric transducer n-layer 7 is formed in such a way that its part coming into contact with the thin, high-density p-layer 34 is formed in a depth a little larger than its part coming into contact with the thick, low-density p-layer 33. The photoelectric transducer n-layer 7 has a shape of a hook, at the end of the shorter side of which the p-layer 34 is formed. This constitution brings about an increase in potential on the read-out side of the photoelectric transducer when the photoelectric transducer n-layer 7 has been depleted. Hence, it becomes possible for the charges in the photoelectric transducer to move with ease at the time of read-out. It therefore becomes easier to prevent residual images from occurring.

In this way, the hook-shaped n-layer is formed in such a way that the joint surface between the p-layer 34 and the n-layer 7 is deeper than the joint surface between the p-layer 33 and the n-layer 7. More specifically, when the p-layer 34 is formed, the ion implantation of boron is carried out at a higher accelerating energy than the accelerating energy used in the ion implantation carried out when the p-layer 33 is formed. Thus, the thickness of the n-layer 7 in the depth direction of the substrate 5 can be increased, so that the potential at that part can be made higher.

As is evident from the above, it is unnecessary to increase the quantity of the impurities led into the photoelectric transducer, which has been done in the prior art. To increase the quantity of impurities necessarily brings about a considerable loss of time. Thus, in the process of the present invention, there can be no lowering of throughput at the time of the fabrication of solid-state image pickup devices.

It is also unnecessary to diffuse the implanted impurities into the depth of the substrate by a high-temperature heat treatment so that the area of the photoelectric transducer can be increased. Hence, no defects can occur in the substrate, which may be caused by the high temperature heat treatment. Since the impurities are diffused from other diffusion-layer, it is still also unnecessary to make control so as to attain the desired impurity density. There also is no possibility that the photoelectric transducer is diffused and spread as a result of the high-temperature heat treatment and consequently diffused also to the vertical CCD transfer channel or the gap region between the transfer channel and the photoelectric transducer electrode 13.

As for the positional relationship between the end portion of the photoelectric transducer and the end portion of the vertical CCD transfer electrode, it can not become difficult to control the position of the diffusion layer as a result of the high-temperature heat treatment. Hence the positional relationship between both can be attained with ease. This can prevent the blooming phenomenon from occurring in the solid-state image pickup device, and also can stop the deterioration of picture quality.

Thereafter, the resist pattern 65 is removed. On the surface of the substrate 5, an electrode material is formed with a region broader than the insulating film 12 and transfer electrode 13. Next, a resist pattern is formed on the region other than the region in which the transfer electrode 13 is formed. Using this resist pattern as a mask, the electrode material is dry-etched. Through the above process, the transfer electrode 13 is formed (FIG. 22).

At this time, the transfer electrode 13 must be provided also on the gap region between the n-layer 7, i.e., the photoelectric transducer from which electrons are read out to the vertical CCD transfer channel, and the p-layer 8. For this purpose, since in the dry etching carried out when the transfer electrode 13 is formed a side wall end of the n-layer 7 serving as the photoelectric transducer is originally on the same line with a side wall end of the transfer electrode 13, one side wall end of the transfer electrode 13 is shortened to be formed in the desired length.

Figure 23:
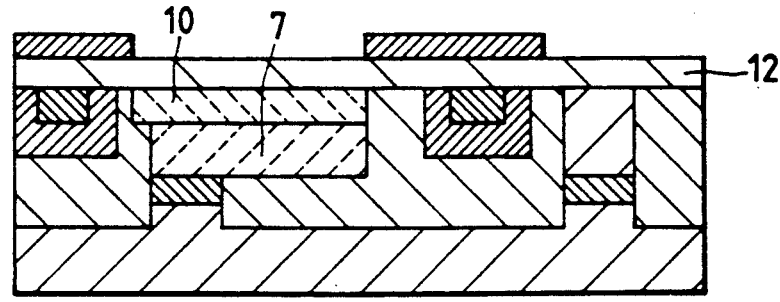

Next, using this transfer electrode 13 and a resist as masks, boron is ion-implanted. The p-layer 10 for preventing dark current is thus formed on the n-layer 7 (FIG. 23).

As described above, in the process for manufacturing the solid-state image pickup device according to the present invention, the n-layer that serves as a photoelectric transducer is formed by ion implantation using a high accelerating energy, and hence the impurity density distribution can be made to have a highest density region in the interior of the substrate.

This brings about an increase in the amount of the effective doners that can be accumulated in the photoelectric transducer, and achieves the quantity of saturation charges at a sufficiently high level.

Since the photoelectric transducer is formed by ion implantation, the positional relationship between the end portion of the photoelectric transducer and the vertical CCD transfer electrode can be determined by the precision for the registration of a mask in the step of exposure carried out when the transfer electrode 13 is formed. Hence it is unnecessary to control the position at which the photoelectric transducer is formed by heat diffusion at a high temperature. Thus, a high controllability can be achieved for the positions of the end portion of the photoelectric transducer and the vertical CCD transfer electrode. This makes the solid-state image pickup device hardly cause the blooming phenomenon, and makes it possible to prevent deterioration of picture quality.

In the impurity density distribution of the n-layer in which the photoelectric transducer is formed by ion implantation, it is possible for the maximum value of its density to be present in the interior of the substrate. This brings about an increase in the amount of the effective doners accumulated in the photoelectric transducer. Hence, it is possible to obtain a solid-state image pickup device equipped with a photoelectric transducer having high saturation characteristics.

The p-layer for preventing dark currents is also formed on the photoelectric transducer n-layer. The n-layer serving as the photoelectric transducer is formed by ion implantation to have a maximum value in its impurity density in the interior of the substrate. Hence, the net value of the impurity density of the p-layer at the surface of the substrate can be made to have a higher density than the impurity density of the p-layer of the conventional solid-state image pickup device. This makes it possible to obtain a solid-state image pickup device equipped with a photoelectric transducer having low dark current characteristics.

In the process for fabricating the solid-state image pickup device of the present invention, the impurity density of the photoelectric transducer is highest in the depth of the substrate. Hence, it is unnecessary to increase the quantity of the impurities implanted in the photoelectric transducer, which has been done in the prior art. To increase the quantity of impurities necessarily brings about a considerable loss of time. Thus, in the process of the present invention, there can be no lowering of throughput at the time of the fabrication of solid-state image pickup devices. In addition, it is possible to prevent the yield from being lowered because of the white scratches.

It is also unnecessary to diffuse the implanted impurities into the depth of the substrate by a high-temperature heat treatment so that the area of the photoelectric transducer can be increased. Hence, no defects can occur in the substrate, which may be caused by the high-temperature heat treatment. Since the impurities are diffused from other diffusion-layer, it is still also unnecessary to make control so as to attain the desired impurity density. There also is no possibility that the photoelectric transducer is diffused and spread as a result of the high-temperature heat treatment and consequently diffused also to the vertical CCD transfer channel or the gap region between the transfer channel and the photoelectric transducer electrode 13.

As for the positional relationship between the end portion of the photoelectric transducer and the end portion of the vertical CCD transfer electrode, it can not become difficult to control the position of the diffusion layer as a result of the high-temperature heat treatment. Hence the positional relationship between the two can be attained with ease. This can prevent the phenomena of blooming and residual image from occurring in the solid-state image pickup device, and also can restrain the deterioration of picture quality.

Examples of n-type photoelectric transducers have been described here, but of course the same effect can be obtained also in the case of p-type photoelectric transducers.

What is claimed is:

1. A solid-state image pickup device comprising a semiconductor substrate; a first semiconductor region of one conductivity type, provided in said semiconductor substrate; a second semiconductor region of a conductivity type reverse to said first semiconductor region, formed in said first semiconductor region; a third semiconductor region of the same conductivity type as said first semiconductor region, formed adjoiningly to the surface of said second semiconductor region; and a fourth semiconductor region to constitute a CCD transfer channel of the same conductivity type as said second semiconductor region, formed apart from said second semiconductor region within said first semiconductor region;

said image pickup device having a net atomic impurity density distribution as a synthesis of individual atomic impurity densities of said first, second and third semiconductor regions, said first, second and third semiconductor regions having respective impurity density distributions as components of said net impurity density distribution;

said second semiconductor region having an individual atomic impurity density whose distribution in the depth direction of said semiconductor substrate has a maximum at a portion interior from the surface of said semiconductor substrate.

2. A solid-state image pickup device comprising a semiconductor substrate; a first semiconductor region of one conductivity type, provided in said semiconductor substrate; a second semiconductor region of a conductivity type reverse to said first semiconductor region, formed in said first semiconductor region; a third semiconductor region of the same conductivity type as said first semiconductor region, formed adjoiningly to the surface of said second semiconductor region; and a fourth semiconductor region to constitute a CCD transfer channel of the same conductivity type as said second semiconductor region, formed apart from said second semiconductor region within said first semiconductor region;

said image pickup device having a net atomic impurity density distribution as a synthesis of individual atomic impurity densities of said first, second and third semiconductor regions, said first, second and third semiconductor regions having respective impurity density distributions as components of said net impurity density distribution;

said first semiconductor region and said second semiconductor region each having a respective individual atomic impurity density whose distribution in the depth direction of said semiconductor substrate has a maximum at a portion interior from the surface of said semiconductor substrate.

3. A solid-state image pickup device comprising a semiconductor substrate; a plurality of first semiconductor regions of one conductivity type, formed in given regions of said semiconductor substrate; a second semiconductor region of a conductivity type reverse to said first semiconductor regions, formed in one of said first semiconductor regions and in a region between said one first semiconductor region and another first semiconductor region adjacent thereto; a third semiconductor region of the same conductivity type as said first semiconductor region, formed at least on the surface of said one first semiconductor region; a fourth semiconductor region to constitute a CCD transfer channel of the same conductivity type as said second semiconductor region, formed apart from said second semiconductor region within said one first semiconductor region; and a fifth semiconductor region of a conductivity type reverse to said semiconductor substrate, formed between said one first semiconductor region and said another first semiconductor region adjacent thereto.

4. A method of driving a solid-state image pickup device, said device comprising a semiconductor substrate; a plurality of first semiconductor regions of one conductivity type, formed in a given region of said semiconductor substrate; a second semiconductor region of a conductivity type reverse to said first semiconductor region, formed in one said first semiconductor region and in a region between said first semiconductor region and another first semiconductor region adjacent thereto; a third semiconductor region of the same conductivity type as said first semiconductor region, formed at least on the surface of said first semiconductor region; a fourth semiconductor region to constitute a CCD transfer channel of the same conductivity type as said second semiconductor region, formed apart from said second semiconductor region within said one first semiconductor region; and a fifth semiconductor region of a conductivity type reverse to said second semiconductor region, formed between said one first semiconductor region and said another first semiconductor region adjacent thereto;

said method comprising applying a reverse bias voltage across said first semiconductor regions and said semiconductor substrate in such a way that a period during which said reverse bias voltage is applied is comprised of a first application period and a second application period, the minimum potential of said first semiconductor regions during the first application period is higher than the minimum potential of said fifth semiconductor region, and the minimum potential of said fifth semiconductor region during the second application period is higher than the minimum potential of said first semiconductor region.

5. The solid-state image pickup device according to claim 3, wherein said fifth semiconductor region is adjoiningly formed to said second semiconductor region on a side opposite to a region where the second semiconductor region is disposed against said fourth semiconductor region in the first semiconductor region, said first semiconductor region being of the same conductivity type as said fifth semiconductor region.

6. The solid-state image pickup device according to claim 3, wherein the minimum potential of said first semiconductor region is higher than the minimum potential of said fifth semiconductor region.

7. The solid-state image pickup device according to claim 3, wherein said fifth semiconductor region is formed adjoiningly to at least a bottom part of said second semiconductor region.

8. A solid-state image pickup device according to claim 7, wherein said fifth semiconductor region is formed as one of in contact with part of, and overlapping with, part of said second semiconductor region.

9. A solid-state image pickup device according to claim 7, wherein the position of the bottom of said fifth semiconductor region in the depth direction of said semiconductor substrate is set shallower than the position of the bottom of said first semiconductor region in the depth direction of said semiconductor substrate.

10. A solid-state image pickup device according to claim 7, wherein the distribution of impurity density of said second semiconductor region in the depth direction of said semiconductor substrate has a maximum part of an interior part from the surface of said semiconductor substrate.

11. A solid-state image pickup device according to claim 7, wherein the distribution of impurity density of each of said first semiconductor region and said second semiconductor region in the depth direction of said semiconductor substrate has a maximum part of an interior part from the surface of said semiconductor substrate.

12. A solid-state image pickup device as recited in claim 1, wherein the individual atomic impurity density of the second semiconductor region is equal to an individual atomic impurity density of the semiconductor substrate at two different distances from the surface of the semiconductor substrate in the interior portion of the semiconductor substrate.

13. A solid-state image pickup device as recited in claim 2, wherein the individual atomic impurity density of the second semiconductor region is equal to an individual atomic impurity density of the semiconductor substrate at two different distances from the surface of the semiconductor substrate in the interior portion of the semiconductor substrate; and the individual atomic impurity density of the first semiconductor region is equal to the individual atomic impurity density of the semiconductor substrate at two different distances from the surface of the semiconductor substrate in the interior portion of the semiconductor substrate.

14. The solid-state image pickup device according to claim 12, wherein the individual atomic impurity density of the second semiconductor region is equal to the individual atomic impurity density of the semiconductor substrate at first and second locations in the interior portion of the semiconductor substrate, wherein a nearer one of said first and second locations to the surface of the semiconductor substrate is in the third semiconductor region.

15. The solid-state image pickup device according to claim 14, further including first, second and third positions in the interior portion of the semiconductor substrate, said first, second and third positions having successively greater distances from the surface of said semiconductor substrate, respectively, wherein:

said first position is at said nearer location wherein said individual atomic impurity density of said second semiconductor region equals the individual atomic impurity density of said semiconductor substrate;

said second position is at a location where an individual atomic impurity density of the third semiconductor region is equal to the individual atomic impurity density of the semiconductor substrate; and said third position is at a location where the individual atomic impurity density of the second semiconductor region is a maximum in the depth direction of the semiconductor substrate.

16. The solid-state image pickup device according to claim 12, wherein said net atomic impurity density distribution is formed by a sum of the individual atomic impurity density distributions of the semiconductor substrate and the first, second and third semiconductor regions, said net atomic impurity density distribution having at least a part where the individual atomic impurity density distribution of the second semiconductor region is a maximum in the depth direction of the semiconductor substrate within a region where donors are accumulated.

17. The solid-state image pickup device according to claim 13, wherein there exists within the second semiconductor region a position where the individual atomic impurity density of the third semiconductor region is equal to the individual atomic impurity density of the semiconductor substrate; and wherein there exist two positions wherein the individual atomic impurity density of the second semiconductor region is equal to the individual atomic impurity density of the semiconductor substrate; a closer one of said two positions to the surface of the semiconductor substrate being within the third semiconductor region.

18. The solid-state image pickup device according to claim 13, wherein the individual atomic impurity density of the first semiconductor region is equal to the individual atomic impurity density of the semiconductor substrate at two locations and among these two locations, the location closer to the surface of the semiconductor substrate exists in the second semiconductor region; and the individual atomic impurity density of the second semiconductor region is equal to the individual atomic impurity density of the semiconductor substrate at two positions and among these two positions, the position being farther removed from the surface of the semiconductor substrate exists in the first semiconductor region.

19. The solid-state image pickup device according to claim 13, wherein a position where the individual atomic impurity density of the second semiconductor region is maximum in the depth direction of the semiconductor substrate, exists between:

a position where the individual atomic impurity density of the third semiconductor region is equal to the individual atomic impurity density of the semiconductor substrate; and one of two locations where the individual atomic impurity density of the first semiconductor region is equal to the individual atomic impurity density of the semiconductor substrate, the one location being the closer of the two locations to the surface of the semiconductor substrate.

20. The solid-state image pickup device according to claim 13, wherein said net atomic impurity density distribution is formed by a sum of the individual atomic impurity density distributions of the semiconductor substrate and the first, second and third semiconductor regions, said net atomic impurity density distribution having at least a part where the individual atomic impurity density distribution of the second semiconductor region is a maximum in the depth direction of the semiconductor substrate within a region where donors are accumulated.

* * * * *

UNITED STATES PATENT AND TRADEMARK OFFICE
CERTIFICATE OF CORRECTION

PATENT NO. : 5,262,661
DATED : November 16, 1993
INVENTOR(S) : Takao KURODA et al It is certified that error appears in the above-indentified patent and that said Letters Patent is hereby corrected as shown below:

On the title page, please delete the Assignee information and insert the following therefor:

--[73]   Assignee: Matsushita Electronics Corportion, Japan--

Signed and Sealed this

Fifth Day of March, 1996

Attest:

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,262,661

DATED : Nov. 16, 1993

INVENTOR(S) : Takao Kuroda et al

It is certified that error appears in the above-identified patent and that said Letters Patent is hereby corrected as shown below:

On the title page, please delete the Assignee information and insert the following therefor:

--[73]  Assignee:  Matsushita Electronics Corporation,
          Japan--

This certificate supersedes Certificate of Correction issued March 5, 1996.

Signed and Sealed this

Eighteenth Day of June, 1996

*Attest:*

BRUCE LEHMAN

*Attesting Officer*      *Commissioner of Patents and Trademarks*